United States Patent
Noda

(10) Patent No.: US 9,998,240 B2
(45) Date of Patent: Jun. 12, 2018

(54) ELECTRIC FIELD INTENSITY DISTRIBUTION MEASUREMENT DEVICE AND ELECTRIC FIELD INTENSITY DISTRIBUTION MEASUREMENT METHOD

(71) Applicant: ANRITSU CORPORATION, Kanagawa (JP)

(72) Inventor: Hanako Noda, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 0 days. days.

(21) Appl. No.: 15/467,400

(22) Filed: Mar. 23, 2017

(65) Prior Publication Data

US 2017/0279544 A1 Sep. 28, 2017

(30) Foreign Application Priority Data

Mar. 28, 2016 (JP) ................. 2016-063628

(51) Int. Cl.
| | | |
|---|---|---|
| *H04B 17/10* | (2015.01) | |
| *H04B 17/12* | (2015.01) | |
| *H04B 17/16* | (2015.01) | |
| *H04L 7/04* | (2006.01) | |

(Continued)

(52) U.S. Cl.
CPC ........... *H04B 17/102* (2015.01); *H04B 17/12* (2015.01); *H04B 17/16* (2015.01); *H04B 17/318* (2015.01); *H04L 7/041* (2013.01); *H04B 17/00* (2013.01)

(58) Field of Classification Search
CPC ........ H04B 17/00; H04B 3/46; H04B 17/102; H04B 17/16; H04B 17/12; H04B 17/318; H04L 12/26; H04L 7/041
See application file for complete search history.

(56) References Cited

U.S. PATENT DOCUMENTS

| | | | | |
|---|---|---|---|---|
| 5,010,343 A | * | 4/1991 | Andersson | G01S 11/04 342/432 |
| 5,086,274 A | * | 2/1992 | Gobin | G01R 27/04 324/230 |

(Continued)

FOREIGN PATENT DOCUMENTS

| | | |
|---|---|---|
| JP | 06-016058 B | 2/1994 |
| WO | 2012-136486 A1 | 10/2012 |
| WO | 2015-162867 A1 | 10/2015 |

*Primary Examiner* — Jean B Corrielus
(74) *Attorney, Agent, or Firm* — Pearne & Gordon LLP

(57) ABSTRACT

An electric field intensity distribution measurement device 1 that measures, in a near field, a radio signal transmitted from an antenna 110 including a plurality of antenna elements T1 to TN integrated into a transmission device 100 includes a measurement antenna 11 that receives the radio signal as a measurement signal at a plurality of scanning points included in a predetermined scanning range, a reference antenna 12 that receives the radio signal as a reference signal, a phase difference and amplitude calculation unit 16 that calculates a phase difference between a measurement signal and a reference signal with respect to each scanning point, and an amplitude of the measurement signal, and a far-field electric field intensity distribution calculation unit 17 that calculates an electric field intensity distribution in a far field using information on the phase difference and the amplitude calculated by the phase difference and amplitude calculation unit 16.

20 Claims, 14 Drawing Sheets

(51) Int. Cl.
*H04B 17/318* (2015.01)
*H04B 17/00* (2015.01)

(56) References Cited

U.S. PATENT DOCUMENTS

| | | | | |
|---|---|---|---|---|
| 6,069,583 | A * | 5/2000 | Silvestrin | G01S 19/29 |
| | | | | 342/357.27 |
| 6,693,588 | B1 * | 2/2004 | Schlee | H01Q 3/267 |
| | | | | 342/165 |
| 6,765,898 | B1 * | 7/2004 | Bloch | H04B 7/08 |
| | | | | 370/342 |
| 9,059,768 | B1 * | 6/2015 | Sorsby | H04B 1/1036 |
| 2003/0123408 | A1 | 7/2003 | Saitou | |
| 2010/0013969 | A1 | 1/2010 | Ui | |
| 2010/0198540 | A1 | 8/2010 | Yanagisawa et al. | |

* cited by examiner

ELECTRIC FIELD INTENSITY DISTRIBUTION MEASUREMENT DEVICE AND ELECTRIC FIELD INTENSITY DISTRIBUTION MEASUREMENT METHOD

TECHNICAL FIELD

The present invention relates to an electric field intensity distribution measurement device and an electric field intensity distribution measurement method, and more particularly, to an electric field intensity distribution measurement device and an electric field intensity distribution measurement method of measuring an electric field intensity distribution of an antenna integrated into a transmission device.

BACKGROUND ART

In a related art, a method of measuring an electric field intensity distribution or directivity of an antenna in a near field using a vector network analyzer (VNA) has been proposed (see, for example, Patent Document 1). As illustrated in FIG. 14, an antenna 220 that is a measurement target that is detachable from a port of a transmission device 210, and a movable measurement antenna 230 are connected to a VNA 200. The VNA 200 causes a radio signal for test to be transmitted from the antenna 220 and compares the radio signal with a radio signal received by the measurement antenna 230 such that an amplitude and a phase of an electric field radiated from the antenna 220 can be simultaneously measured.

However, in recent years, a type of a transmission device that includes an antenna including a large number of antenna elements, such as a multi input multi output (MIMO) antenna, in which the antenna is not detachable from the transmission device due to a request for an increase in the number of antenna elements or miniaturization of the device, or the like is widely used. The measurement method for a single entity of an antenna using a VNA as described above cannot be applied to the antenna of such a transmission device.

RELATED ART DOCUMENT

Patent Document

[Patent Document 1] JP-A-6-16058

DISCLOSURE OF THE INVENTION

Problem that the Invention is to Solve

However, in the electric field intensity distribution measurement device disclosed in Patent Document 1, an output of a VNA is supplied to the antenna as a reference signal for measuring a phase, a signal received by the VNA is compared with a transmission signal to extract phase difference information. Therefore, there is a problem in that this scheme cannot be used since the reference signal cannot be extracted in a system in which an antenna is not detachable.

The present invention has been made to solve such problems of the related art, and an object of the present invention is to provide an electric field intensity distribution measurement device and an electric field intensity distribution measurement method capable of calculating an electric field intensity distribution in a far field by comparing a signal received by a reference receiver with a signal received by a measurement receiver to obtain phase difference information and combining the phase difference information with amplitude information received by the measurement receiver to perform near field measurement on a radio signal transmitted from an antenna integrated into a transmission device.

Means for Solving the Problem

In order to solve the above problem, an electric field intensity distribution measurement device according to 1st aspect of the present invention is an electric field intensity distribution measurement device that measures a radio signal transmitted from an antenna including a plurality of antenna elements integrated into a transmission device in a near field and calculates an electric field intensity distribution in a far field, and includes a measurement antenna that receives the radio signal as a measurement signal at a plurality of scanning points included in a predetermined scanning range; a reference antenna that receives the radio signal as a reference signal; measurement frequency conversion means for frequency-converting the measurement signal received by the measurement antenna; measurement A/D conversion unit that digitizes the measurement signal frequency-converted by the measurement frequency conversion means to generate a digital measurement signal; reference frequency conversion means for frequency converting the reference signal received by the reference antenna; reference A/D conversion unit that digitizes the reference signal frequency-converted by the reference frequency conversion means to generate a digital reference signal; a phase difference and amplitude calculation unit that calculates a phase difference between a phase of the digital measurement signal and a phase of the digital reference signal with respect to each scanning point, and calculates an amplitude of the digital measurement signal; and a far-field electric field intensity distribution calculation unit that calculates an electric field intensity distribution in a far field of the antenna under measurement, using information on the phase difference and the amplitude calculated by the phase difference and amplitude calculation unit.

Further, in the electric field intensity distribution measurement device according to 2nd aspect of the present invention, the antenna under measurement may include a plurality of antenna elements (T1 to TN) integrated in the transmission device, and the reference antenna is arranged outside the scanning range.

With this configuration, it is possible to perform near field measurement on the radio signal transmitted from the antenna integrated into the transmission device and calculate an electric field intensity distribution in the far field. Further, with this configuration, it is possible to calculate the amplitude and the phase using a modulated signal without using the pilot signal (a signal with constant amplitude).

Further, the electric field intensity distribution measurement device according to 3rd aspect of the present invention may further include frequency synchronization means for performing frequency synchronization between the measurement frequency conversion means and the reference frequency conversion means; phase difference and amplitude calculation processing timing synchronization means for synchronizing timings of start of data acquisition to the phase difference and amplitude calculation unit of the digital measurement signal and the digital reference signal; and A/D conversion clock synchronization means for synchronizing sampling clocks of the measurement A/D conversion unit and the reference A/D conversion unit.

Further, in the electric field intensity distribution measurement device according to 4th aspect of the present invention, the measurement frequency conversion means may further include a measurement down-converter that is directly connected to a connector for the measurement antenna.

At the time of measurement at a high frequency such as a millimeter wave, a bending radius of a coaxial cable between the antenna and the reception unit fluctuates or twisting occurs by causing the antenna to perform scanning. Accordingly, a phase of the radio signal transferred in the coaxial cable fluctuates, which affects a measurement result. On the other hand, it is possible to suppress a change in the phase in a measurement system by decreasing a frequency of the radio signal received by the measurement antenna and the reference antenna in an early stage.

Further, the electric field intensity distribution measurement device according to 5th aspect of the present invention further may include a spectrum analysis unit that analyzes a spectrum of the measurement signal received by the measurement antenna.

With this configuration, in a case where measurement of the electric field intensity distribution and measurement for evaluating quality of a radio signal are desired to be performed on one transmission device, it is not necessary for reconnection of the antenna under measurement and a measurement system to be performed in each measurement. Therefore, it is possible to sequentially execute, for one transmission device, measurement of an electric field intensity distribution and measurement for evaluating quality of a radio signal such as a frequency, an occupied bandwidth, adjacent channel leakage power, and spurious radiation.

Further, in the electric field intensity distribution measurement device according to 6th aspect of the present invention, the radio signal further may be an unmodulated wave signal. In this case, it is also possible to detect a phase difference with a suppressed processing amount, for example, using a cross-correlation function in the phase difference and amplitude calculation unit.

In an electric field intensity distribution measurement device according to 7th aspect of the present invention, the radio signal may be a broadband signal including a plurality of frequency components. In this case, since it is necessary to recognize the electric field intensity distribution in a communication band rather than a single frequency in measurement of a transmission system that handles a broadband modulated signal, it is necessary to measure electric field intensity at a plurality of frequency points in a scanning range. In this case, it is possible to extract amplitude and phase difference information for each subcarrier by performing an FFT calculation on a result of A/D conversion of a reception signal of each of a measurement signal reception unit and a reference signal reception unit using the OFDM signal as the radio signal. Here, information on the measurement signal reception unit is extracted as the amplitude information, and a difference between phase information of the measurement signal and phase information of the reference signal is extracted as the phase difference information. Accordingly, it is possible to measure in-band electric field intensity distribution by omitting a plurality of scanning and exchange of a transmission signal (switching of frequencies of a transmission signal), and it is possible to shorten measurement time.

Further, in the electric field intensity distribution measurement device according to 8th aspect of the present invention, the spectrum analysis unit may include an analysis processing unit that performs various types of analysis involving a frequency, an occupied bandwidth, adjacent channel leakage power, and spurious radiation.

Further, in the electric field intensity distribution measurement device according to 9th aspect of the present invention, the frequency synchronization means may be a local signal source installed in the spectrum analysis unit, and the local signal source is shared by a spectrum analysis frequency conversion means included in the spectrum analysis unit, the measurement frequency conversion means, and the reference frequency conversion means.

Further, in the electric field intensity distribution measurement device according to 10th aspect of the present invention, the measurement signal frequency-converted by the measurement frequency conversion means may be branched before the measurement A/D conversion unit and input to spectrum analysis frequency conversion means included in the spectrum analysis unit, and the spectrum analysis unit may include a local signal source of the spectrum analysis frequency conversion means.

Further, in the electric field intensity distribution measurement device according to 11th aspect of the present invention, the digital measurement signal may be directly input to the analysis processing unit in the spectrum analysis unit.

Further, in the electric field intensity distribution measurement device according to 12th aspect of the present invention, the measurement frequency conversion means further may include a measurement down-converter connected in close proximity to a connector of the measurement antenna, and the measurement down-converter may include a frequency multiplier that frequency-multiplies a local signal generated by the frequency synchronization means; a mixer that mixes the measurement signal received by the measurement antenna with the local signal frequency-multiplied by the frequency multiplier; and a filter that removes unnecessary frequency components from an output signal of the mixer.

Further, in the electric field intensity distribution measurement device according to 13th aspect of the present invention, the measurement frequency conversion means further may include a measurement down-converter connected in close proximity to a connector of the measurement antenna, and the measurement down-converter may include a harmonic mixer that frequency-converts the measurement signal received by the measurement antenna using a frequency component obtained by performing frequency multiplication on a local signal generated by the frequency synchronization means; and a filter that removes unnecessary frequency components from an output signal of the harmonic mixer.

Further, in the electric field intensity distribution measurement device according to 14th aspect of the present invention, the reference frequency conversion means further may include a reference down-converter directly connected to a connector of the reference antenna.

Further, in the electric field intensity distribution measurement device according to 15th aspect of the present invention, the measurement frequency conversion means further may include a measurement down-converter connected in close proximity to a connector of the measurement antenna.

Further, in the electric field intensity distribution measurement device according to 16th aspect of the present invention, the reference frequency conversion means further may include a reference down-converter connected in close proximity to a connector of the reference antenna.

An electric field intensity distribution measurement method according to 17th aspect of the present invention is a field intensity distribution measurement method using any one of the electric field intensity distribution measurement devices, and includes a synchronization step of performing frequency synchronization between the measurement frequency conversion means and the reference frequency conversion means, and synchronizing sampling clocks of the measurement A/D conversion unit and the reference A/D conversion unit; a signal reception step of receiving the radio signal as a measurement signal at a plurality of scanning points included in a predetermined scanning range using the measurement antenna, and receiving the radio signal as a reference signal using the reference antenna; a frequency conversion step of frequency-converting the measurement signal received in the signal reception step using the measurement frequency conversion means and frequency-converting the reference signal received in the signal reception step using the reference frequency conversion means; an A/D conversion step of simultaneously digitizing the measurement signal and the reference signal frequency-converted in the frequency conversion step using the measurement A/D conversion unit and the reference A/D conversion unit to generate a digital measurement signal and a digital reference signal; a phase difference and amplitude calculation step of calculating a phase difference between a phase of the digital measurement signal and a phase of the digital reference signal with respect to each scanning point, and calculating an amplitude of the digital measurement signal; and a far-field electric field intensity distribution calculation step that calculates an electric field intensity distribution in a far field using information on the phase difference and the amplitude calculated in the phase difference and amplitude calculation step.

With this configuration, it is possible to perform near field measurement on the radio signal transmitted from the antenna integrated into the transmission device and calculate an electric field intensity distribution in the far field.

Advantage of the Invention

The present invention relates to an electric field intensity distribution measurement device and an electric field intensity distribution measurement method capable of performing near field measurement on a radio signal transmitted from an antenna integrated into a transmission device and calculating an electric field intensity distribution in a far field.

BEST MODE FOR CARRYING OUT THE INVENTION

Hereinafter, embodiments of an electric field intensity distribution measurement device and an electric field intensity distribution measurement method according to the present invention will be described with reference to the drawings.

(First Embodiment)

Figure 1:
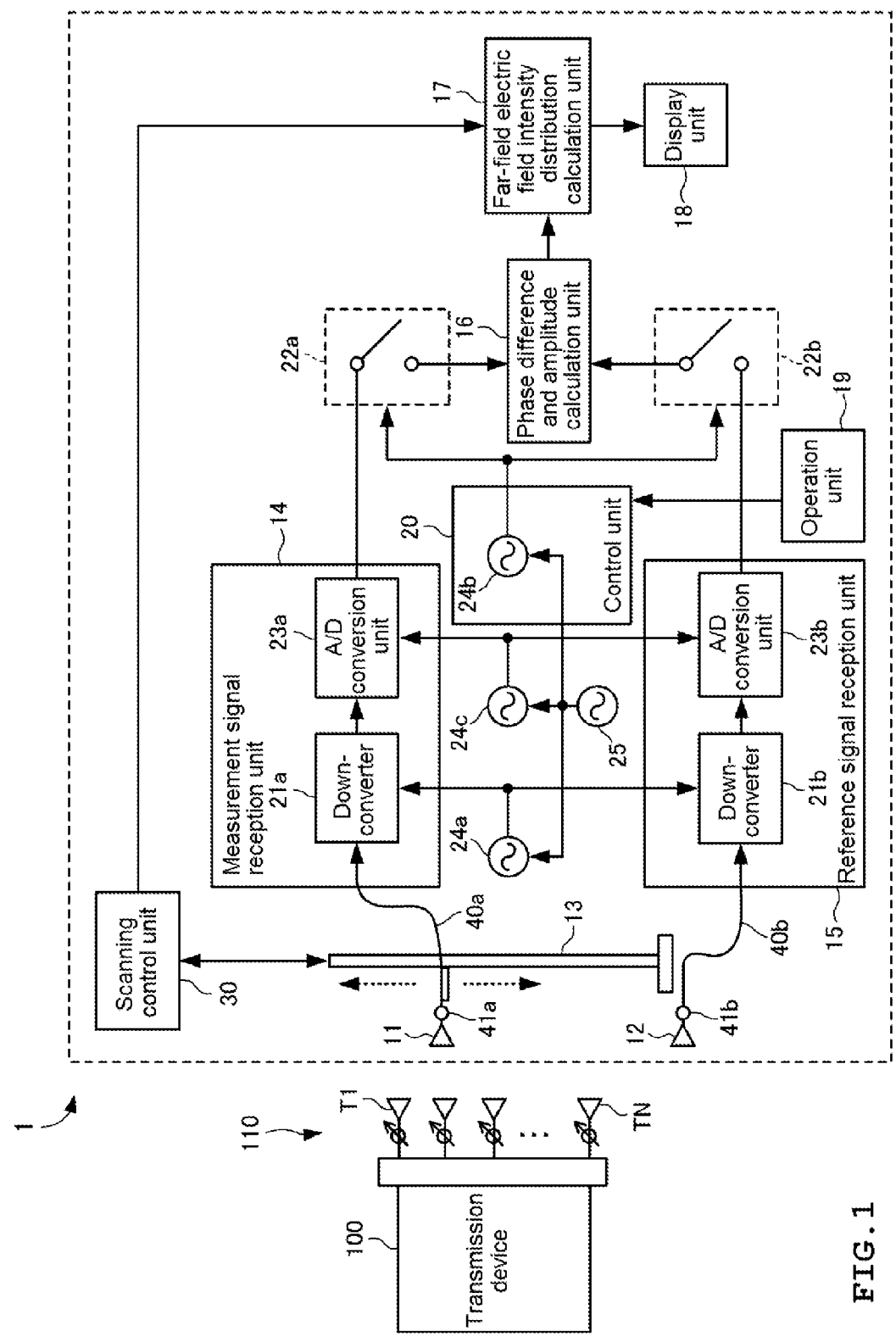
FIG. 1 is a block diagram illustrating a configuration of an electric field intensity distribution measurement device according to a first embodiment.

As illustrated in FIG. 1, an electric field intensity distribution measurement device 1 according to a first embodiment of the present invention measures, in a near field, a radio signal that is transmitted from an antenna 110 including a plurality of antenna elements T1 to TN integrated into a transmission device 100, and calculates an electric field intensity distribution in a far field.

The antenna 110 is, for example, an array antenna including a Massive-MIMO antenna. An unmodulated wave signal (an unmodulated wave or a continuous wave), a multi-carrier signal (for example, an OFDM signal), or the like can be used as a radio signal that is transmitted from the antenna 110 of the transmission device 100 when the electric field intensity distribution measurement device 1 measures the electric field intensity distribution.

The electric field intensity distribution measurement device 1 mainly includes a measurement antenna 11, a reference antenna 12, a movement device 13, a measurement signal reception unit 14 serving as a measurement receiver, a reference signal reception unit 15 serving as a reference receiver, a phase difference and amplitude calculation unit 16, a far-field electric field intensity distribution calculation unit 17, a display unit 18, an operation unit 19, and a control unit 20.

The measurement antenna 11 and the reference antenna are antennas that receive, in the near field, radio waves radiated from the antenna 110 including the plurality of antenna elements T1 to TN of the transmission device 100. The measurement antenna 11 receives a radio signal transmitted from the antenna 110 of the transmission device 100 as a measurement signal at a plurality of scanning points included in a predetermined scanning range. Further, the reference antenna 12 is arranged outside the scanning range of the measurement antenna 11, and receives the radio signal transmitted from the antenna 110 of the transmission device 100 as a reference signal.

If the position of the reference antenna 12 approaches the measurement antenna 11, an influence of multiple reflections from the measurement antenna 11 as well as the antenna 110 of the transmission device 100 is included. Further, if the reference antenna 12 is arranged at a position far from the measurement antenna 11, a signal of the antenna 110 of the transmission device 100 cannot be detected. Accordingly, it is necessary to install the reference antenna 12 at an appropriate position.

The movement device 13 moves the measurement antenna 11 in a predetermined scanning range including a plurality of scanning points.

The measurement signal reception unit 14 includes a down-converter 21a as measurement frequency conversion means, an A/D conversion unit 23a as a measurement A/D conversion unit, and a switch 22a as phase difference and amplitude calculation processing timing synchronization means. The down-converter 21a frequency-converts a measurement signal received by the measurement antenna 11.

The A/D conversion unit 23a digitizes the measurement signal subjected to the frequency conversion by the down-converter 21a. Specifically, the A/D conversion unit 23a samples the measurement signal after frequency conversion with a predetermined sampling clock to generate a digital measurement signal as time-series digital data. The switch 22a determines a phase difference and amplitude calculation start timing in the phase difference and amplitude calculation unit 16 of the digital measurement signal according to a synchronization signal output from a synchronization signal source 24b that will be described below. For example, acquisition of the phase difference and amplitude calculation unit 16 is controlled by a gate signal from the synchronization signal source 24b.

The reference signal reception unit 15 includes a down-converter 21b as reference frequency conversion means, an A/D conversion unit 23b as a reference A/D conversion unit, and a switch 22b as phase difference and amplitude calculation processing timing synchronization means. The down-converter 21b frequency-converts a reference signal received by the reference antenna 12.

The A/D conversion unit 23b digitizes the reference signal subjected to the frequency conversion by the down-converter 21b. Specifically, the A/D conversion unit 23b samples the reference signal after frequency conversion with a predetermined sampling clock to generate a digital reference signal as time-series digital data. The switch 22b determines a phase difference and amplitude calculation start timing in the phase difference and amplitude calculation unit 16 of the digital reference signal according to the synchronization signal output from the synchronization signal source 24b that will be described below. For example, acquisition of the phase difference and amplitude calculation unit 16 is controlled by the gate signal from the synchronization signal source 24b.

The measurement antenna 11 is connected to the down-converter 21a by a cable 40a such as a coaxial cable being connected to a connector 41a thereof. Similarly, the reference antenna 12 is connected to the down-converter 21b by a cable 40b such as a coaxial cable being connected to a connector 41b thereof.

The phase difference and amplitude calculation unit performs a process of calculating a phase of the digital measurement signal and a phase of the digital reference signal using a scheme such as fast Fourier transform (FFT) with respect to each scanning point in the scanning range of the measurement antenna 11. Further, the phase difference and amplitude calculation unit 16 performs a process of calculating an amplitude of the digital measurement signal.

For example, in a case where the radio signal transmitted from the antenna 110 of the transmission device 100 is an unmodulated wave, the phase difference and amplitude calculation unit 16 can detect a phase difference with a suppressed processing amount, for example, using a cross-correlation function. Further, in a case where the radio signal transmitted from the antenna 110 of the transmission device 100 is an OFDM signal, the phase difference and the amplitude are calculated for each subcarrier. By using a broadband signal of OFDM or the like, it is possible to measure an electric field intensity signal in a broadband at a time and contribute to realization of a high speed.

Further, the phase difference and amplitude calculation unit 16 outputs information on the calculated phase difference and amplitude (hereinafter also referred to as "phase difference information" and "amplitude information") to the far-field electric field intensity distribution calculation unit 17. The phase difference information at each scanning point may be converted into a value with a phase difference at a specific scanning point in the scanning range as a reference (phase zero).

The far-field electric field intensity distribution calculation unit 17 calculates an electric field intensity distribution in the far field using position information of the measurement antenna 11 output from a scanning control unit 30 to be described below and the information on the phase difference and the amplitude calculated by the phase difference and amplitude calculation unit 16. Here, it is possible to estimate the electric field intensity distribution in the far field by performing numerical calculation of a known near field/far field conversion method and obtain directivity of the antenna 110 of the transmission device 100.

The display unit 18 includes, for example, a display device such as an LCD or a CRT, and displays various types of display content according to a control signal from the control unit 20. This display content includes a measurement result of the electric field intensity distribution in the near field of the antenna 110 that is an antenna under measurement, a calculation result of the electric field intensity distribution in the far field, or the like. Further, the display unit 18 may display an operation target such as a soft key, a pull-down menu, or a text box for setting measurement conditions or the like.

The operation unit 19 is intended for a user to perform an operation input, and includes an input device such as a keyboard, a touch panel, or a mouse. Alternatively, as described above, the operation unit 19 may have a configuration in which operation targets such as buttons, soft keys, pull-down menus, or text boxes are displayed on the display unit 18.

Further, the electric field intensity distribution measurement device 1 includes a local signal source 24a, a synchronization signal source 24b, a clock signal source 24c, and a reference signal source 25, as a configuration for performing synchronization between the measurement signal reception unit 14 and the reference signal reception unit 15.

The local signal source 24a serving as frequency synchronization means outputs a synchronizing signal for frequency-synchronizing the down-converter 21a with the down-converter 21b to the down-converters 21a and 21b.

Accordingly, frequency conversion amounts of the down-converters 21a and 21b are the same.

Figure 2:
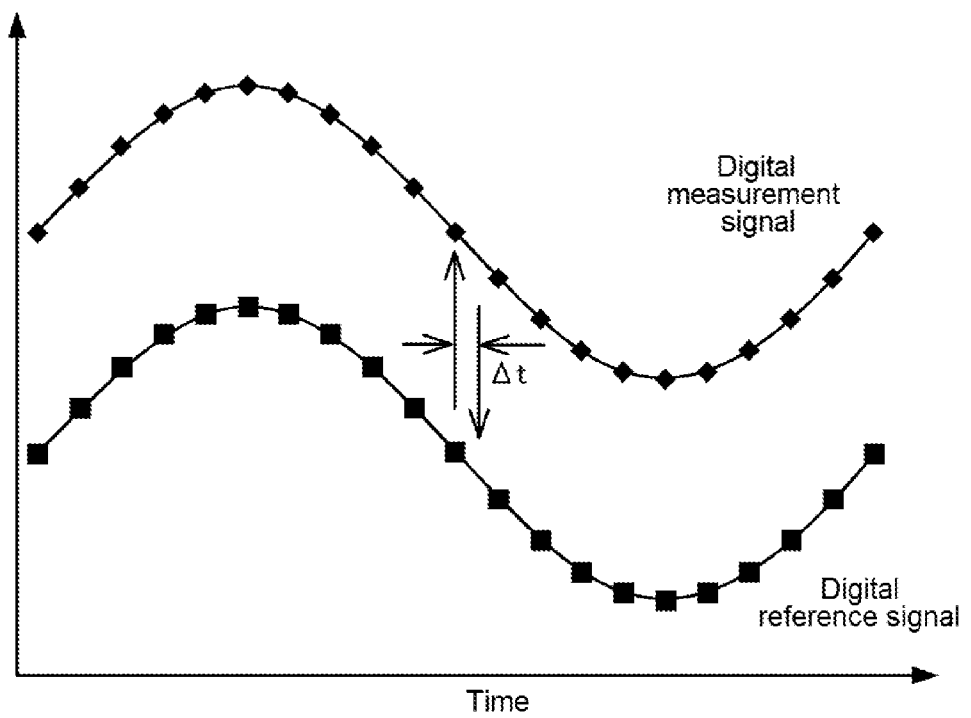
FIG. 2 is a graph for explaining phase difference and amplitude calculation processing by the electric field intensity distribution measurement device according to the first embodiment.

In a case where the digital measurement signal and the digital reference signal are captured with a time difference Δt by the phase difference and amplitude calculation unit 16 as illustrated in FIG. 2, a large error is included in a calculation result. In order to avoid such a situation, the synchronization signal source 24b serving as phase difference and amplitude calculation processing timing synchronization means outputs a synchronization signal for synchronizing start and end timings of a phase difference and amplitude calculation process in the phase difference and amplitude calculation unit 16 to the switches 22a and 22b. Specifically, when the phase difference and the amplitude are calculated, the synchronization signal source 24b outputs a gate signal for synchronization to simultaneously turn on the switches 22a and 22b. Accordingly, start timings of data acquisition to the phase difference and amplitude calculation unit 16 of the digital measurement signal and the digital reference signal are synchronized.

The clock signal source 24c serving as A/D conversion clock synchronization means outputs a synchronization signal for synchronizing the sampling clocks of the A/D conversion unit 23a and the A/D conversion unit 23b to the A/D conversion units 23a and 23b.

Thus, for the digital measurement signal and the digital reference signal, the sampling clocks by the A/D conversion units 23a and 23b are synchronized, and the calculation start and end timings in the phase difference and amplitude calculation unit 16 are synchronized. Thus, it is possible to calculate the phase difference (or a relative value of the phase difference) at the scanning point (measurement point) at which the measurement antenna serving as a measurement probe exists with high accuracy, and it is possible to obtain the electric field intensity distribution in the far field using the phase difference and the amplitude.

The reference signal source 25 outputs a reference signal for performing synchronization among the local signal source 24a, the synchronization signal source 24b, and the clock signal source 24c to the local signal source 24a, the synchronization signal source 24b, and the clock signal source 24c.

The control unit 20 is configured, for example, as a microcomputer including a CPU, a ROM, a RAM, and the like, and controls the operation of each of the units constituting the electric field intensity distribution measurement device 1. Further, the control unit 20 includes the synchronization signal source 24b. Further, the control unit 20 executes a predetermined program to configure the phase difference and amplitude calculation unit 16, the far-field electric field intensity distribution calculation unit 17, and the scanning control unit 30 in software.

The scanning control unit 30 controls a position of the measurement antenna 11 by operating the movement device 13 and transmits position information indicating a position of a scanning point at which the measurement antenna 11 exists, to the far-field electric field intensity distribution calculation unit 17.

Figure 3:
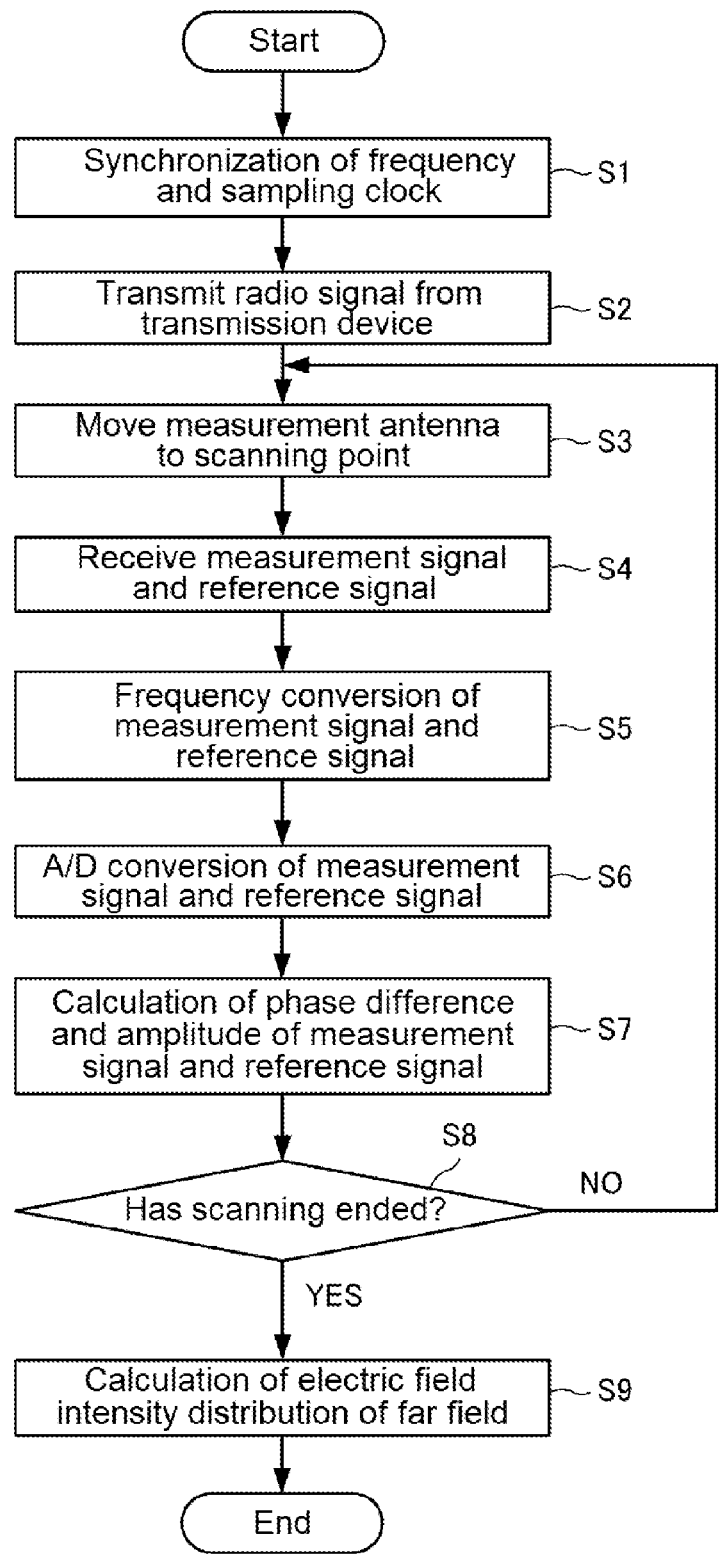
FIG. 3 is a flowchart illustrating processing of the electric field intensity distribution measurement method by the electric field intensity distribution measurement device according to the first embodiment.

Hereinafter, an electric field intensity distribution measurement method using the electric field intensity distribution measurement device 1 according to this embodiment will be described with reference to a flowchart of FIG. 3.

First, the frequency synchronization between the two down-converters 21a and 21b and the clock synchronization between the two A/D conversion units 23a and 23b are performed by the synchronization signal from the local signal source 24a and the clock signal source 24c (synchronization step S1).

Then, the transmission device 100 transmits the radio signal (step S2). Then, the scanning control unit 30 moves the measurement antenna 11 to the scanning point in the scanning range using the movement device 13 (step S3).

Then, the measurement antenna 11 receives the radio signal output from the transmission device 100 as a measurement signal, and the reference antenna 12 receives the radio signal as a reference signal (signal reception step S4).

Then, the down-converter 21a frequency-converts the measurement signal received in step S4, and the down-converter 21b frequency-converts the reference signal received in step S4 (frequency conversion step S5).

Then, the two A/D conversion units 23a and 23b simultaneously digitize the measurement signal and the reference signal frequency-converted in step S5 to generate a digital measurement signal and a digital reference signal (A/D conversion step S6).

Then, the phase difference and amplitude calculation unit 16 starts calculation of a phase difference between the phase of the measurement signal (the digital measurement signal) digitized in step S6 and the phase of the reference signal (the digital reference signal) digitized in step S6, and an amplitude of the digital measurement signal when the switches 22a and 22b are simultaneously turned on (phase difference and amplitude calculation step S7).

Then, the control unit 20 determines whether or not position information, phase difference information, and amplitude information are obtained for all the scanning points in the scanning range (step S8). In a case where the determination is negative, the process returns to step S3. In a case where the determination is positive, the process proceeds to step S9.

Then, the far-field electric field intensity distribution calculation unit 17 calculates the electric field intensity distribution in the far field using the position information, the phase difference information, and the amplitude information regarding all the scanning points (far-field electric field intensity distribution calculation step S9).

As described above, the electric field intensity distribution measurement device 1 according to this embodiment can perform near field measurement on the radio signal transmitted from the antenna 110 integrated into the transmission device 100 and calculate the electric field intensity distribution in the far field.

(Second Embodiment)

Next, an electric field intensity distribution measurement device 2 according to a second embodiment of the present invention will be described with reference to the drawings. The same components as those of the electric field intensity distribution measurement device 1 according to the first embodiment are denoted with the same reference numerals, and detailed description thereof will be omitted.

In the electric field intensity distribution measurement device 1 according to the first embodiment, the measurement antenna 11 and the reference antenna 12 are connected to the down-converters 21a and 21b via the cables 40a and 40b, respectively. However, if the cable 40a bends or changes its direction at the time of scanning with the measurement antenna 11, a phase of the measurement signal that is a high-frequency signal in, for example, a millimeter wave band, may change while the measurement signal is being transferred via the cable 40a.

Therefore, in this embodiment, a configuration is adopted in which the down-converters are separated from the measurement signal reception unit 14 and the reference signal reception unit 15, respectively, and the measurement antenna 11 and the reference antenna 12 are directly connected to the down-converters, respectively, to decrease frequencies of the measurement signal and the reference signal before the measurement signal is transferred via the cable.

Figure 4:
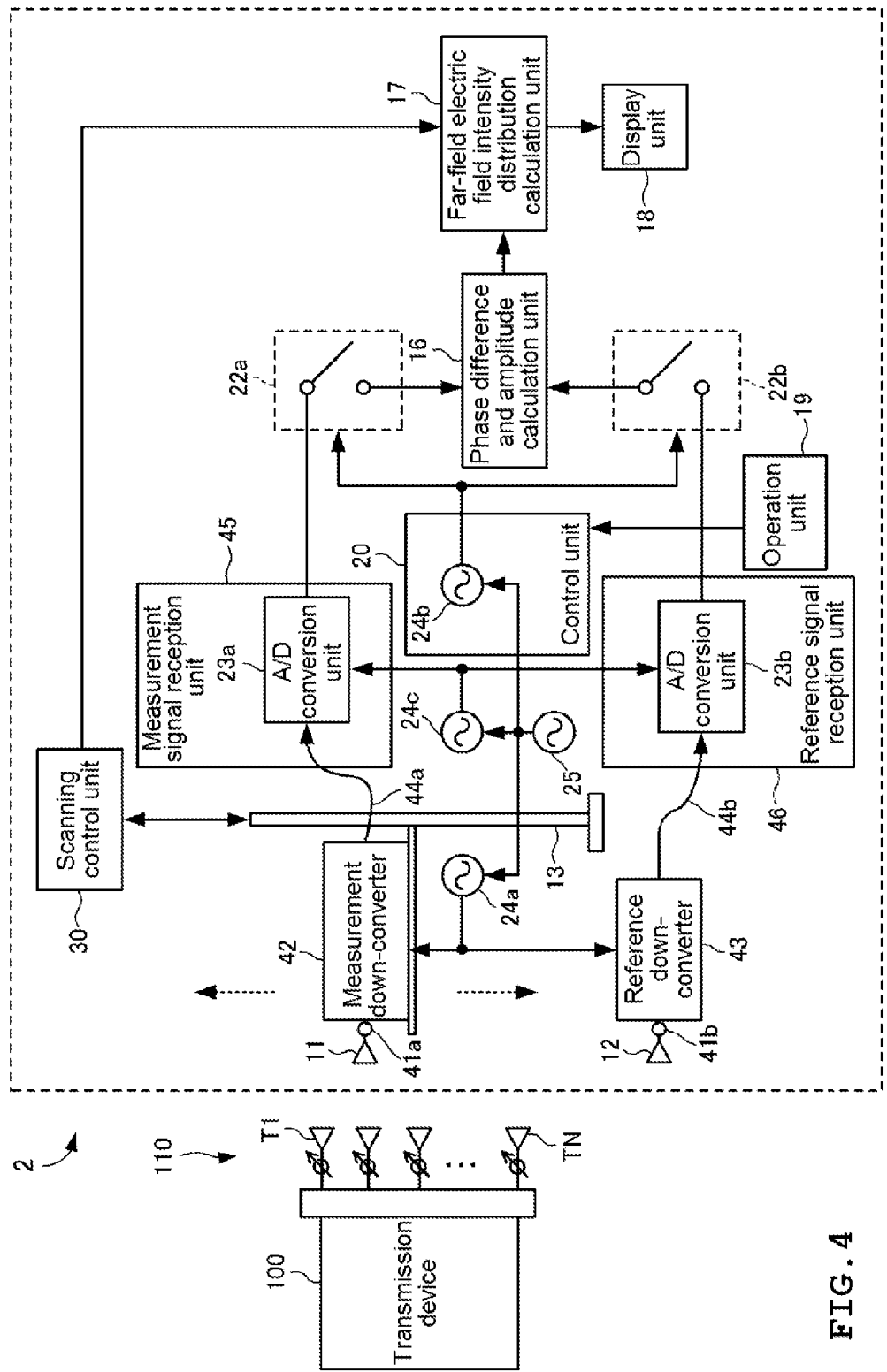
FIG. 4 is a block diagram illustrating a configuration of an electric field intensity distribution measurement device according to a second embodiment.

That is, as illustrated in FIG. 4, a measurement down-converter 42 serving as the measurement frequency conversion means is directly connected to a connector 41a of the measurement antenna 11 without via a cable. Similarly, a reference down-converter 43 serving as the reference frequency conversion means is directly connected to a connector 41b of the reference antenna 12 without via a cable. The measurement down-converter 42 and the reference down-converter 43 may be connected in close proximity to the connector 41a of the measurement antenna 11 and the connector 41b of the reference antenna 12.

The measurement down-converter 42 is connected to a measurement signal reception unit 45 that is a subsequent stage by a cable 44a. Similarly, the reference down-converter 43 is connected to a reference signal reception unit 46 that is a subsequent stage by a cable 44b.

A local signal source 24a outputs a synchronization signal for performing frequency synchronization between the measurement down-converter 42 and the reference down-converter 43 to the measurement down-converter 42 and the reference down-converter 43.

The measurement down-converter 42 is moved in a scanning range together with the measurement antenna 11 by a movement device 13. Similarly, the reference down-converter 43 may be fixed or may be moved in a scanning range together with the reference antenna 12 by the movement device 13.

As described above, the electric field intensity distribution measurement device 2 according to this embodiment can prevent a phase from changing when a radio signal is transferred to the A/D conversion units 23a and 23b that are subsequent stages via the cables 44a and 44b, by directly connecting the measurement antenna 11 and the reference antenna 12 to the measurement down-converter 42 and the reference down-converter 43, respectively.

(Third Embodiment)

Next, an electric field intensity distribution measurement device 3 according to a third embodiment of the present invention will be described with reference to the drawings. The same components as those of the electric field intensity distribution measurement device 1 or 2 according to the first or second embodiment are denoted with the same reference numerals, and detailed description thereof will be omitted.

Figure 5:
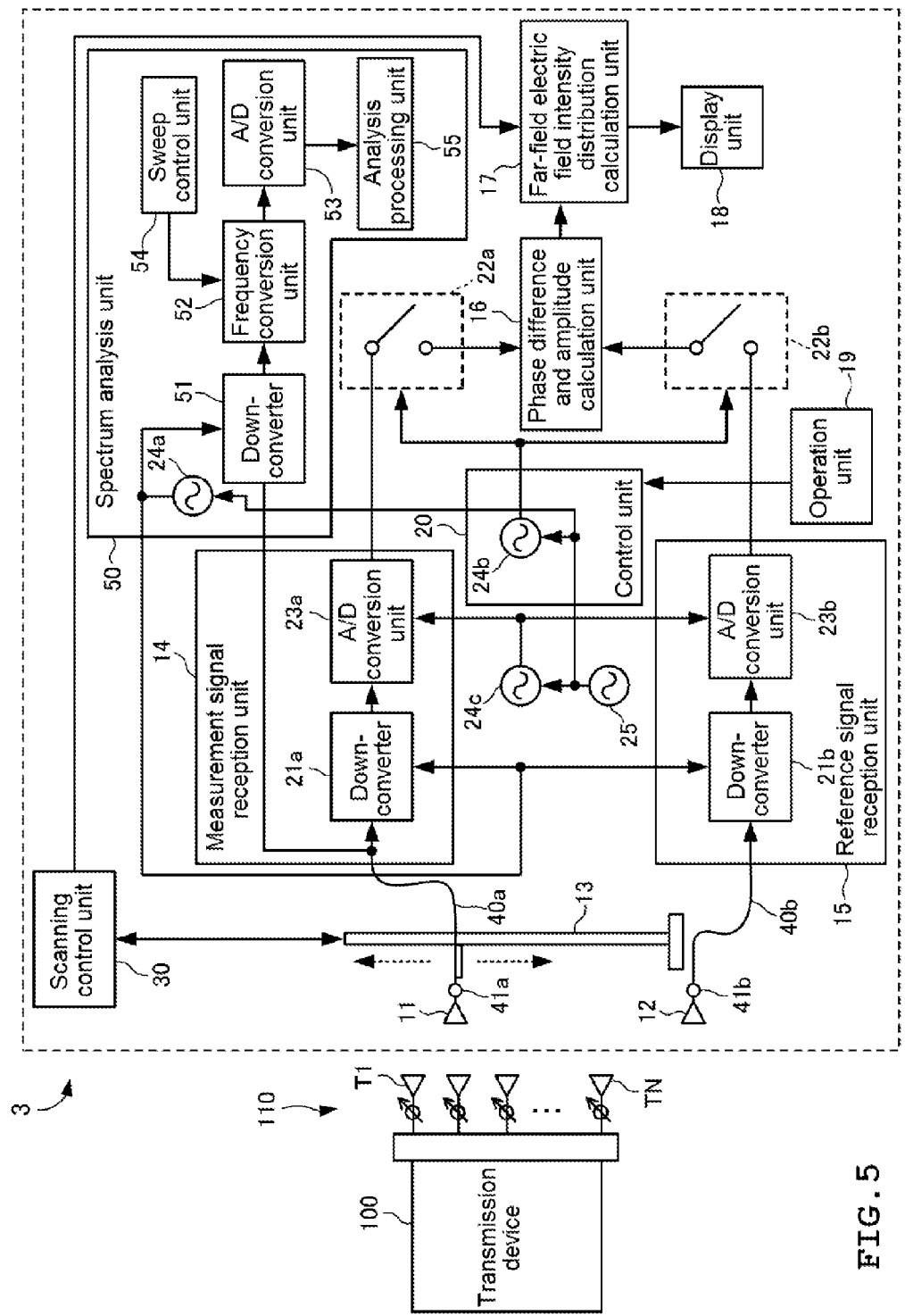
FIG. 5 is a block diagram illustrating a configuration of an electric field intensity distribution measurement device according to a third embodiment.

As illustrated in FIG. 5, the electric field intensity distribution measurement device 3 further includes a spectrum analysis unit 50 that functions as a spectrum analyzer that analyzes a spectrum of a measurement signal received by a measurement antenna 11.

The spectrum analysis unit 50 includes a down-converter 51, a frequency conversion unit 52, an A/D conversion unit 53, a sweep control unit 54, and an analysis processing unit 55.

The measurement signal received by the measurement antenna 11 is branched before a down-converter 21a of a measurement signal reception unit 14 and is input to the down-converter 21a and the down-converter 51 of the spectrum analysis unit 50.

The down-converter 51 outputs the measurement signal down-converted by mixing (multiplying) an output signal from a local signal source 24a with (by) the measurement signal to the frequency conversion unit 52. The local signal source 24a may be installed within the spectrum analysis unit 50.

The frequency conversion unit 52 includes, for example, a local oscillator, a mixer, and a band-pass filter, and is configured such that an oscillation frequency of the local oscillator is swept by the sweep control unit 54. The measurement signal input to the frequency conversion unit 52 is converted into an intermediate frequency signal, which is output from the frequency conversion unit 52. Accordingly, with respect to the measurement signal, sweep measurement can be performed in an arbitrary measurement frequency range.

The A/D conversion unit 53 samples the intermediate frequency signal output from the frequency conversion unit at a predetermined clock to convert the intermediate frequency signal into time-series digital data.

The analysis processing unit 55 associates the time-series digital data output from the A/D conversion unit 53 with the measurement frequency and performs various types of analysis. For example, the analysis processing unit 55 performs a process of analyzing a frequency, an occupied bandwidth, adjacent channel leakage power, spurious radiation, or the like.

In the electric field intensity distribution measurement device 3 illustrated in FIG. 5, for example, the local signal source 24a installed in the spectrum analysis unit 50 can be a local signal source of several GHz, and the local signal source 24a can be shared by the down-converters 21a and 21b (or the measurement down-converter 42 and the reference down-converter 43). The electric field intensity distribution measurement device 3 having such a configuration in FIG. 5 is preferable in a case where the frequency of the measurement signal received by the measurement antenna 11 is a relatively low frequency (for example, about 3 GHz).

Figure 6:
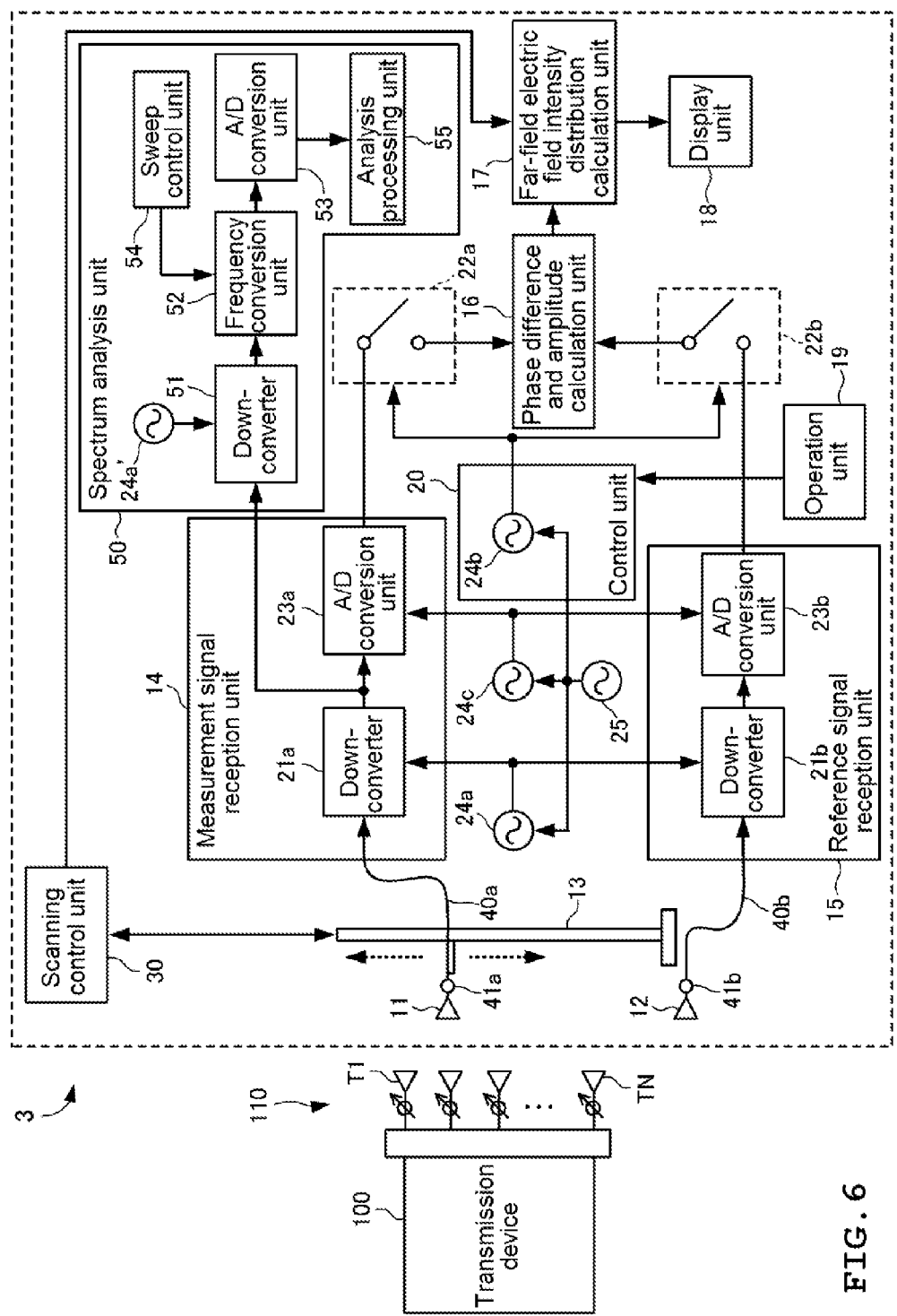
FIG. 6 is a block diagram illustrating another configuration of the electric field intensity distribution measurement device according to the third embodiment.

FIG. 6 illustrates another configuration example of the electric field intensity distribution measurement device 3. As illustrated in FIG. 6, a measurement signal down-converted by a down-converter 21a of a measurement signal reception unit 14 is branched before an A/D conversion unit 23a of the measurement signal reception unit 14, and is input to the A/D conversion unit 23a and a down-converter 51 of a spectrum analysis unit 50. The down-converter 51 of the spectrum analysis unit 50 further down-converts the measurement signal frequency-converted by the down-converter 21a of the measurement signal reception unit 14. The down-converter 51 of the spectrum analysis unit 50 is connected to a local signal source 24a'.

In the electric field intensity distribution measurement device 3 illustrated in FIG. 6, for example, a local signal source 24a connected to the down-converter 21a (or, the measurement down-converter 42) can be a local signal source for tens of GHz, and the local signal source 24a' of the down-converter 51 of the spectrum analysis unit 50 can be a local signal source of several GHz. With this configuration, it is not necessary for the down-converter for a high frequency originally provided in the spectrum analysis unit to be installed in the spectrum analysis unit 50, and the down-converter 21a (or, the measurement down-converter 42) can be shared by the measurement signal reception unit 14 and the spectrum analysis unit 50 as the down-converter for a high frequency. The electric field intensity distribution measurement device 3 having such a configuration in FIG. 6 is preferable in a case where the frequency of the measurement signal received by the measurement antenna 11 is a relatively high frequency (for example, about 60 GHz).

Figure 7:
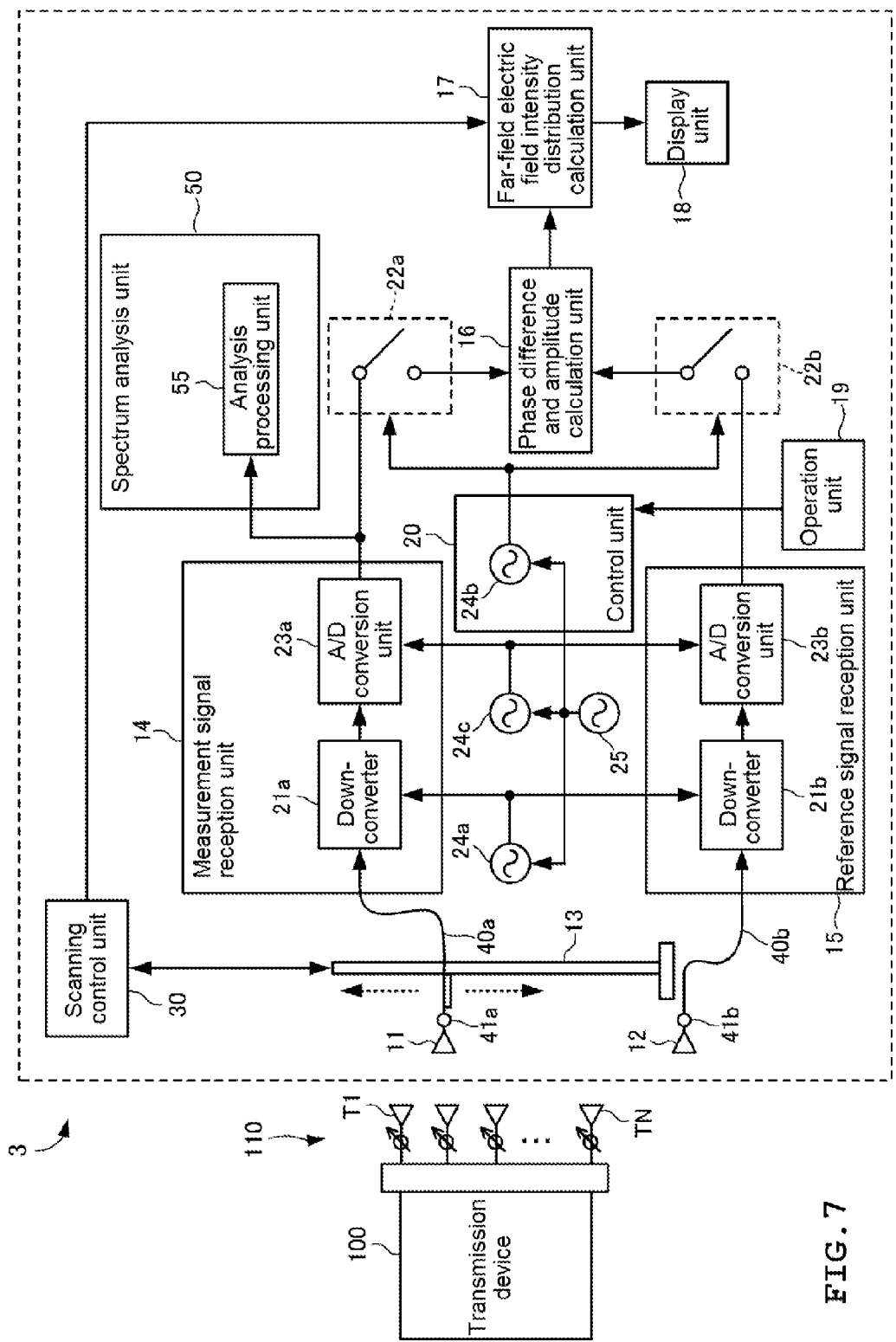
FIG. 7 is a block diagram illustrating still another configuration of the electric field intensity distribution measurement device according to the third embodiment.

FIG. 7 illustrates still another configuration example of the electric field intensity distribution measurement device 3. As illustrated in FIG. 7, a measurement signal digitized by an A/D conversion unit 23a of a measurement signal reception unit 14 is directly input to an analysis processing unit 55 of a spectrum analysis unit 50.

The electric field intensity distribution measurement device 3 illustrated in FIG. 7 has a configuration that can be applied to a case where the transmission device 100 separates a frequency to generate the radio signal. In this configuration, only arithmetic processing in the analysis processing unit 55 may be performed in the spectrum analysis unit 50, and the down-converter 21a (or the measurement down-converter 42) and the A/D conversion unit 23a can be shared.

As described above, the electric field intensity distribution measurement device 3 according to this embodiment can sequentially execute, for one transmission device, measurement of an electric field intensity distribution and measurement for evaluating quality of a radio signal such as a frequency, an occupied bandwidth, adjacent channel leakage power, and spurious radiation without preparing a separate spectrum analyzer.

(Fourth Embodiment)

Next, an electric field intensity distribution measurement device 4 according to a fourth embodiment of the present invention will be described with reference to FIG. 8. The same components as those of the electric field intensity distribution measurement device 1 according to the first embodiment are denoted with the same reference numerals, and detailed description thereof will be omitted.

In this embodiment, as a radio signal to be transmitted from the antenna under measurement 110 of the transmission device 100 when the electric field intensity distribution is measured by the electric field intensity distribution measurement device 4, an unmodulated wave signal (an unmodulated wave or a continuous wave), a broadband signal (for example, OFDM signal) or the like can be used.

Figure 8:
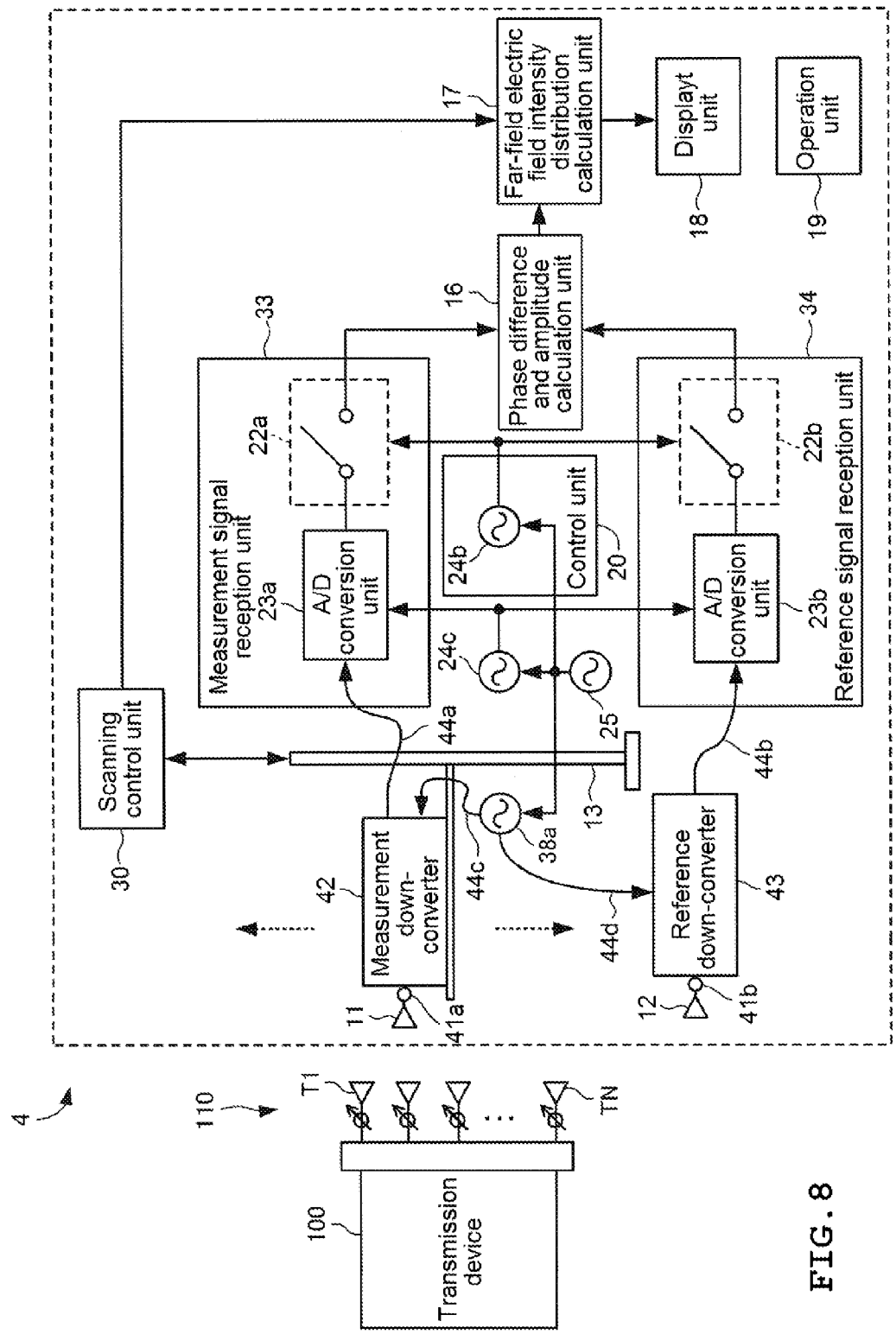
FIG. 8 is a block diagram illustrating a configuration of an electric field intensity distribution measurement device according to the fourth embodiment.

In this embodiment, the configuration in which the reference antenna 12 is directly connected to the reference down-converter 43, and the frequency of the reference signal is decreased before the reference signal is transferred via the cable, as illustrated in FIG. 8, is adopted. That is, as illustrated in FIG. 8, the reference down-converter 43 serving as reference frequency conversion means is connected in close proximity to the connector 41b of the reference antenna 12 without via a wiring such as a coaxial cable.

The reference down-converter 43 is connected to a reference signal reception unit 34 that is a subsequent stage by a cable 44b, and is connected to a local signal source 24a by a cable 44d. The cables 44c and 44d are made as, for example, a coaxial cable. The reference down-converter 43 frequency-converts (down-converts) the reference signal received by the reference antenna 12 into an intermediate frequency signal and outputs the intermediate frequency signal to the reference signal reception unit 34.

The reference signal reception unit 34 includes an A/D conversion unit 23b serving as a reference A/D conversion unit, and a switch 22b serving as phase difference and amplitude calculation processing timing synchronization means.

The measurement antenna 11 integrated into the measurement down-converter 42 is moved in a scanning range by a movement device 13. The reference antenna 12 integrated into the reference down-converter 43 may be fixed or may be moved in the scanning range by the movement device 13.

Figure 9A:
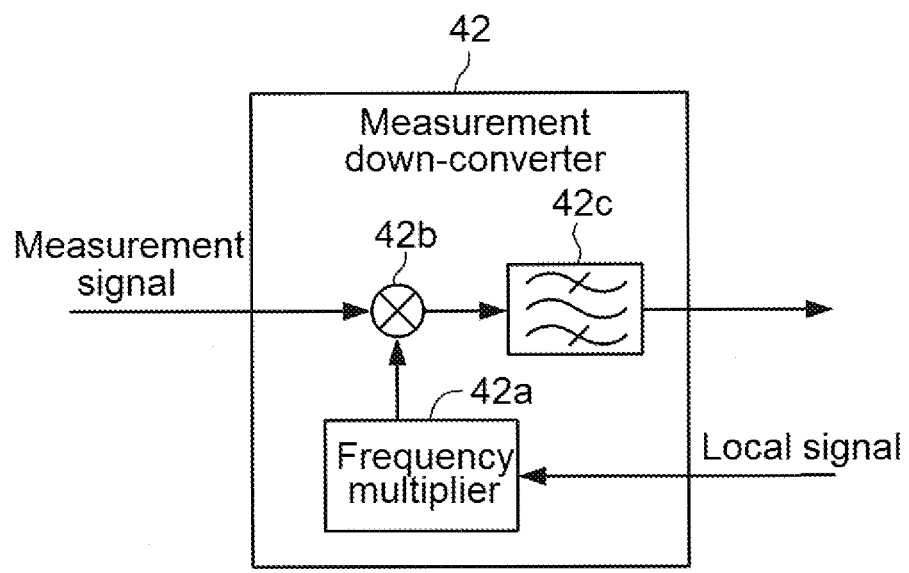
FIG. 9A and FIG. 9B show a detailed configuration of the measurement down-converter according to the fourth embodiment.

Cables 44a and 44c are bent or change their directions at the time of scanning of the measurement antenna 11. Accordingly, in a case where a high frequency signal in a millimeter wave band or the like is transferred via the cables 44a and 44c, a phase thereof may be changed. Therefore, a detailed configuration of the measurement down-converter 42 is the same as illustrated in FIG. 9A so that the high frequency signal in a millimeter wave band is not transferred to the cables 44a and 44c.

That is, the measurement down-converter 42 includes a frequency multiplier 42a that frequency-multiplies a local signal generated by a local signal source 24a, a mixer 42b that mixes a measurement signal received by the measurement antenna 11 with the local signal frequency-multiplied by the frequency multiplier 42a, and a filter 42c provided in a stage subsequent to the mixer 42b. The filter 42c is provided in order to remove unnecessary frequency components from an output signal of the mixer 42b, and may be a band-pass filter or may be a low-pass filter.

That is, the measurement down-converter 42 converts the local signal into the high frequency signal using the frequency multiplier 42a and mixes the high frequency signal with the measurement signal received by the measurement antenna 11. Accordingly, for example, with respect to the measurement signals of 25 GHz to 145 GHz, it is possible to set the frequency of the intermediate frequency signal propagating through the cable 44a to about 10 GHz while suppressing the frequency of the local signal propagating through the cable 44c to 5 GHz to 10 GHz.

Figure 9B:
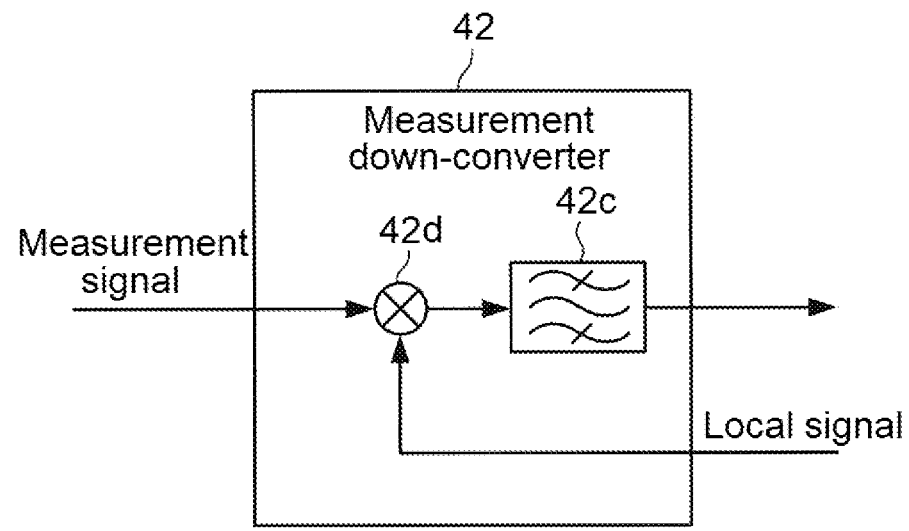

As illustrated in FIG. 9B, the measurement down-converter 42 includes a harmonic mixer 42d, and a filter 42c provided in a stage subsequent to the harmonic mixer 42d. The harmonic mixer 42d can frequency-convert the measurement signal received by the measurement antenna 11 using a frequency component obtained by performing frequency multiplication on the local signal generated by the local signal source 24a. Here, the filter 42c is provided in order to remove unnecessary frequency components from an output signal of the harmonic mixer 42d, and may be a band-pass filter or may be a low-pass filter.

As described above, in the electric field intensity distribution measurement device 4 according to this embodiment, it is possible to prevent the phase from being changed when the radio signal is transferred to the A/D conversion unit 27 that is a subsequent stage via the cable 44a by directly connecting the measurement antenna 11 to the measurement down-converter 42.

Further, in the electric field intensity distribution measurement device 4 according to this embodiment, by directly connecting the measurement antenna 11 to the reference down-converter 32, it is possible to prevent the phase from being changed when the radio signal is transferred to the A/D conversion unit 37 that is a subsequent stage via the cable 28c.

Further, in the electric field intensity distribution measurement device 4 according to this embodiment, in a case where the radio signal transmitted from the antenna under measurement 110 of the transmission device 100 is an OFDM signal, the phase difference and the amplitude are calculated for each subcarrier. By using a broadband signal of OFDM or the like, it is possible to measure an electric field intensity signal in a broadband at a time and contribute to realization of a high speed.

(Fifth Embodiment)

Next, an electric field intensity distribution measurement device 5 according to a fifth embodiment of the present invention will be described with reference to FIG. 10. The same components as those of the electric field intensity distribution measurement devices 1 to 4 according to the first to fourth embodiments are denoted with the same reference numerals, and detailed description thereof will be omitted.

Figure 10:
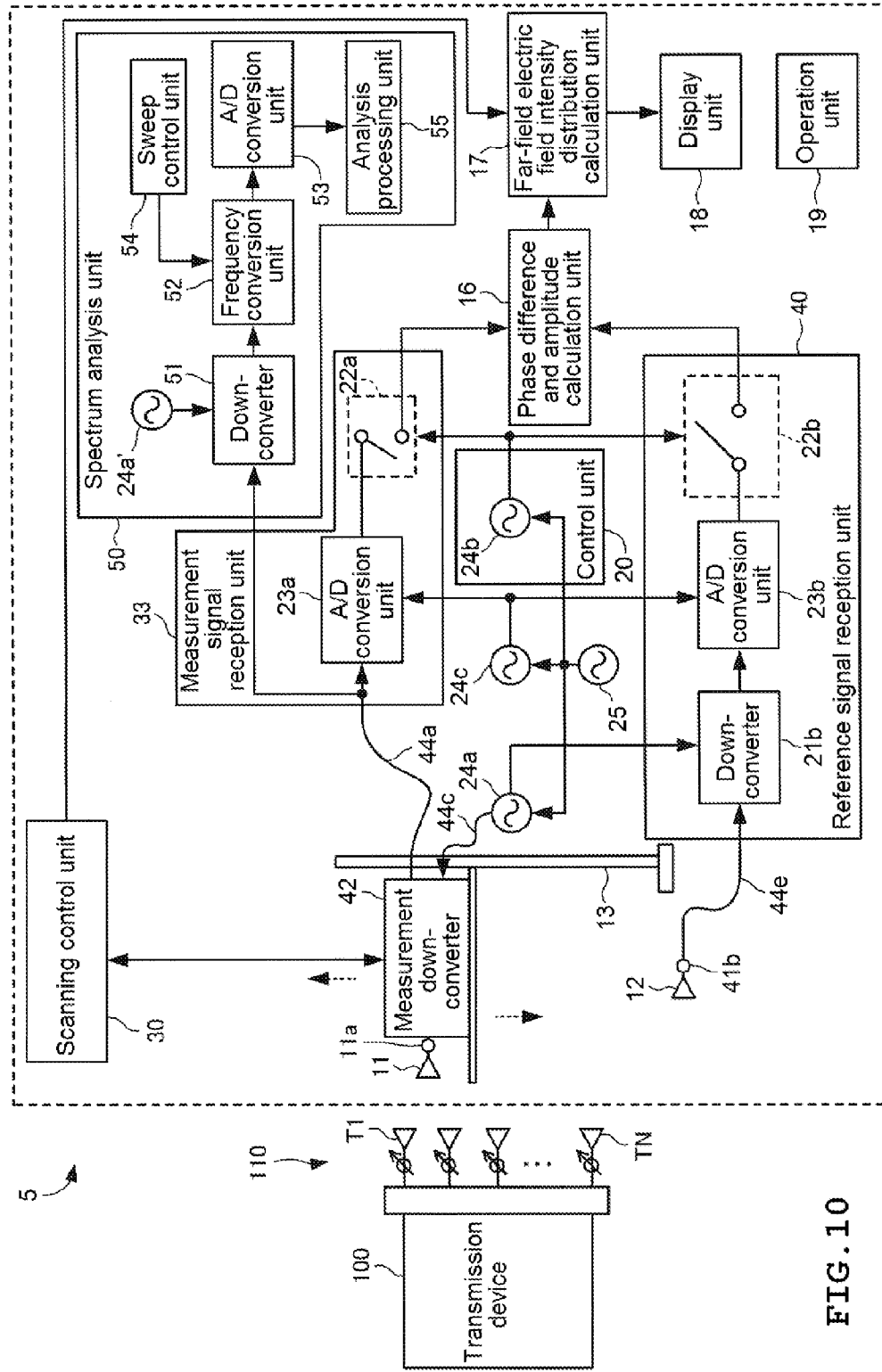
FIG. 10 is a block diagram illustrating a configuration of an electric field intensity distribution measurement device according to the fifth embodiment.

As illustrated in FIG. 10, the electric field intensity distribution measurement device 5 mainly includes a measurement antenna 11, a movement device 13, a measurement down-converter 42, a reference antenna 12, a measurement signal reception unit 33 serving as a measurement receiver, a reference signal reception unit 15 serving as a reference receiver, a phase difference and amplitude calculation unit 16, a far-field electric field intensity distribution calculation unit 17, a display unit 18, an operation unit 19, a control unit 20, and a spectrum analysis unit 50.

The reference signal reception unit 40 includes a down-converter 21b serving as reference frequency conversion means, an A/D conversion unit 23b serving as a reference A/D conversion unit, and a switch 22b serving as phase difference and amplitude calculation processing timing synchronization means. The down-converter 21b frequency-converts a reference signal received by the reference antenna 12.

The A/D conversion unit 37 digitizes the reference signal frequency-converted by the down-converter 41. Further, the reference antenna 31 is connected to the down-converter 41 by a cable 44e such as a coaxial cable being connected to a connector 11b thereof.

The spectrum analysis unit 50 functions as a spectrum analyzer that analyzes a spectrum of a measurement signal received by the measurement antenna 11, and the spectrum analysis unit 50 includes a down-converter 51, a frequency conversion unit 52, an A/D conversion unit 53, a sweep control unit 54, and an analysis processing unit 55.

The measurement signal received by the measurement antenna 11 and down-converted by the measurement down-converter 17 is branched before the A/D conversion unit 27 of the measurement signal reception unit 33, and is input to the A/D conversion unit 27 and the down-converter 51 of the spectrum analysis unit 50.

The down-converter 51 of the spectrum analysis unit 50 further down-converts the measurement signal frequency-converted by the measurement down-converter 17 and outputs a resultant signal to the frequency conversion unit 52. The down-converter 51 is connected to a local signal source 24a'.

In the electric field intensity distribution measurement device 5 illustrated in FIG. 10, for example, a local signal source 24a connected to the measurement down-converter 42 can be a local signal source for tens of GHz, and the local signal source 24a' of the down-converter 51 of the spectrum analysis unit 50 can be a local signal source of several GHz. With this configuration, it is not necessary for the down-converter for a high frequency originally provided in the spectrum analysis unit to be installed in the spectrum analysis unit 50, and the measurement down-converter 17 can be shared by the measurement signal reception unit 33 and the spectrum analysis unit 50 as the down-converter for a high frequency. The electric field intensity distribution measurement device 5 having such a configuration in FIG. 10 is preferable in a case where the frequency of the measurement signal received by the measurement antenna 11 is a relatively high frequency (for example, about 60 GHz).

Figure 11:
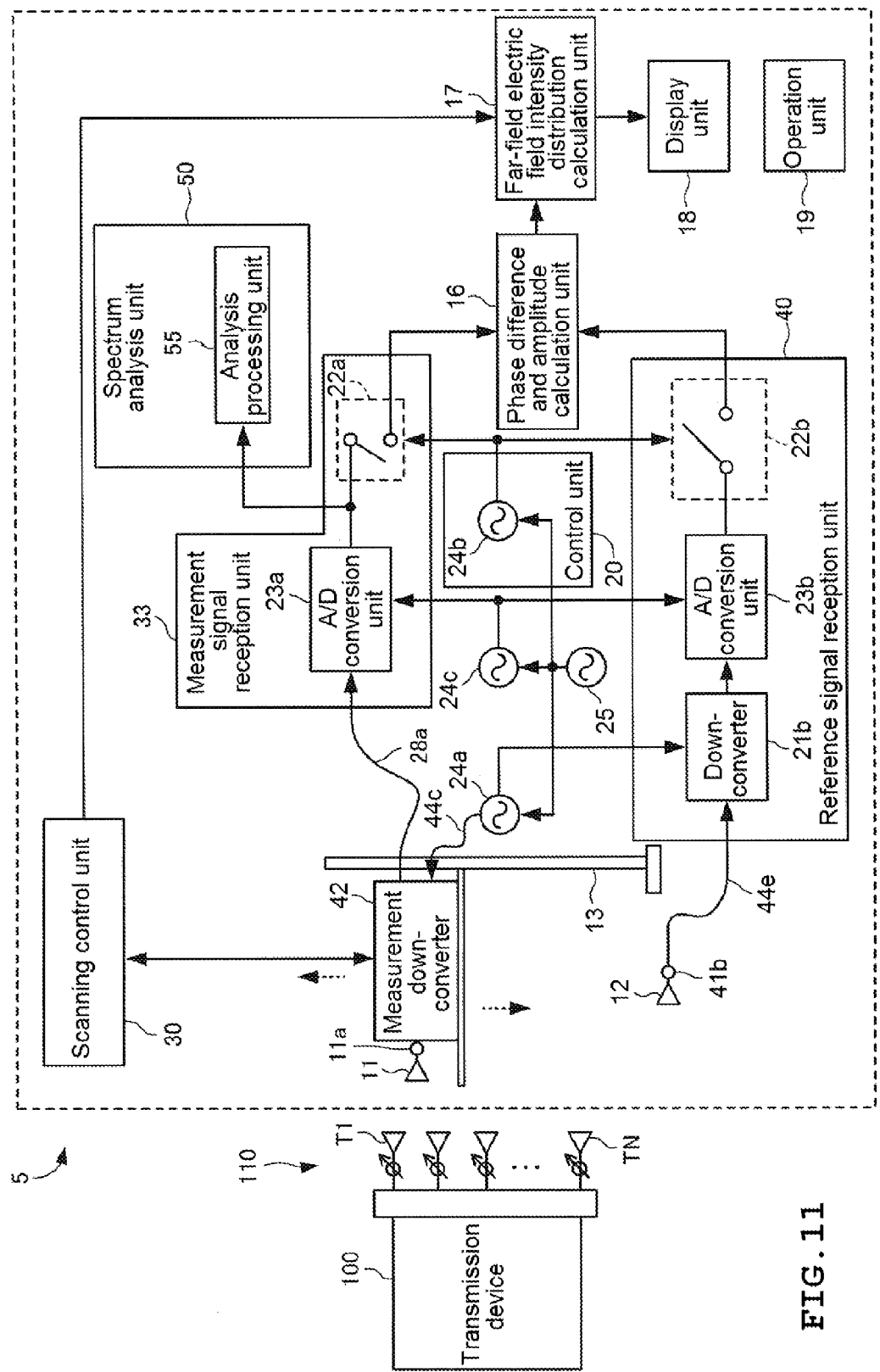
FIG. 11 is a block diagram illustrating another configuration of an electric field intensity distribution measurement device according to the fifth embodiment.

FIG. 11 illustrates another configuration example of the electric field intensity distribution measurement device 5. As illustrated in FIG. 10, a measurement signal digitized by an A/D conversion unit 37 of a measurement signal reception unit 33 is directly input to an analysis processing unit 55 of a spectrum analysis unit 50.

The electric field intensity distribution measurement device 5 illustrated in FIG. 11 has a configuration that can be applied to a case where the transmission device 100 separates a frequency to generate the broadband signal. In this configuration, only arithmetic processing in the analysis processing unit 55 may be performed in the spectrum analysis unit 50, the measurement down-converter 17 and the A/D conversion unit 27 can be shared.

In the configuration illustrated in FIGS. 10 and 11, the reference antenna 31 and the down-converter 41 may be integrated, as in the second embodiment. Further, the measurement antenna 11 integrated into the measurement down-converter 17 is moved in the scanning range by the movement device 13. The reference antenna 31 integrated into the down-converter 41 may be fixed or may be moved in the scanning range by the movement device 13.

As described above, in the electric field intensity distribution measurement device 5 according to this embodiment, in a case where measurement of the electric field intensity distribution and measurement for evaluating quality of a radio signal are desired to be performed on one transmission device 100, it is not necessary for reconnection of the antenna under measurement 110 and a measurement system to be performed in each measurement.

Therefore, the electric field intensity distribution measurement device 5 according to this embodiment can sequentially execute, for one transmission device 100, measurement of an electric field intensity distribution and measurement for evaluating quality of the radio signal such as a frequency, an occupied bandwidth, in-band frequency characteristics, adjacent channel leakage power, and spurious radiation without preparing a separate spectrum analyzer.

(Sixth Embodiment)

Next, an electric field intensity distribution measurement device 6 according to a sixth embodiment of the present invention will be described with reference to the drawings. The same components as those of the electric field intensity distribution measurement devices 1 to 5 according to the first to fifth embodiments are denoted with the same reference numerals, and detailed description thereof will be omitted.

Figure 12:
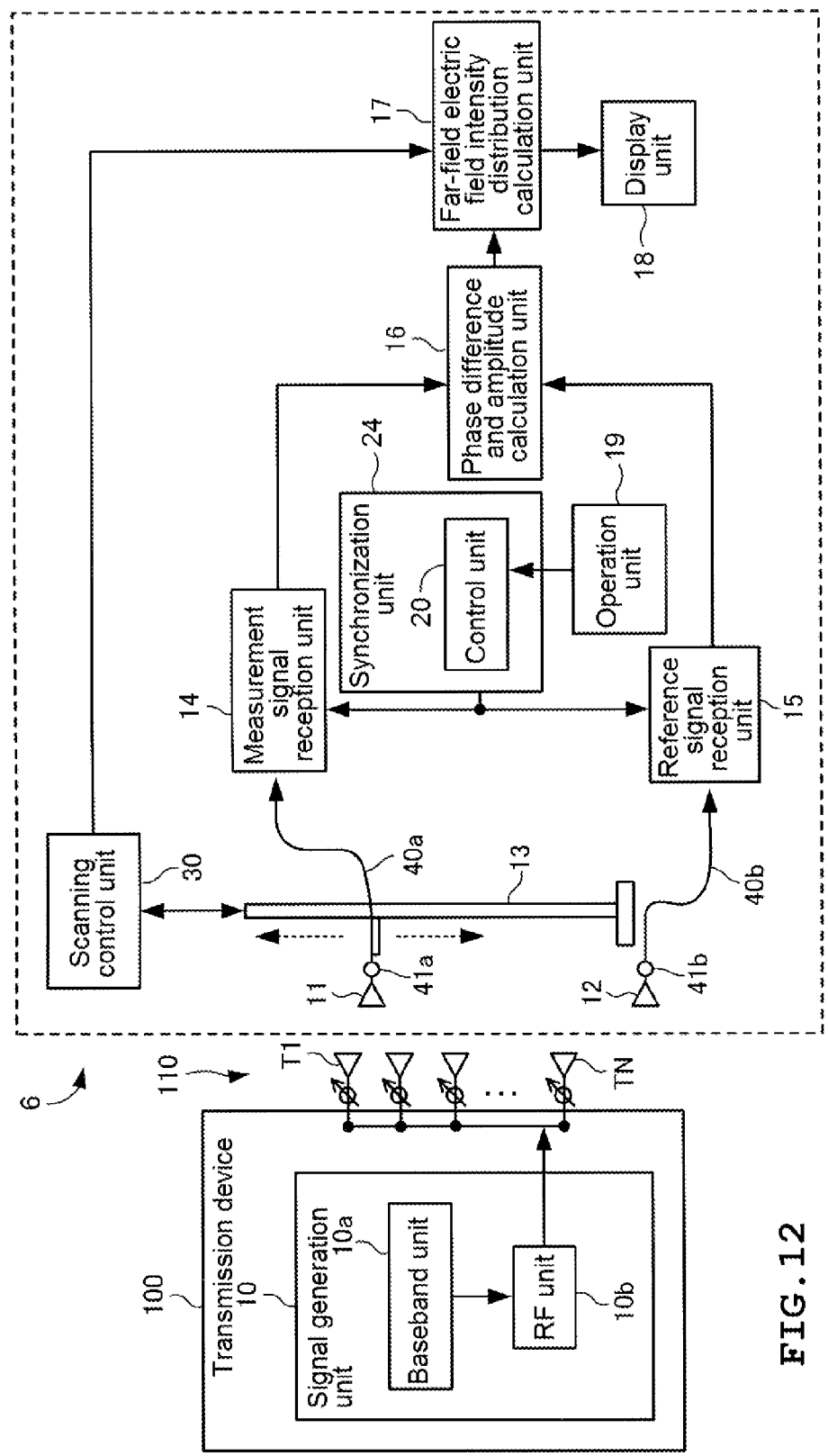
FIG. 12 is a block diagram illustrating a configuration of an electric field intensity distribution measurement device according to the sixth embodiment.

As illustrated in FIG. 12, an electric field intensity distribution measurement device 6 according to the sixth embodiment of the present invention measures, in a near field, a radio signal that is transmitted from an antenna under measurement 110 including a plurality of antenna elements T1 to TN included in the transmission device 100, and calculates an electric field intensity distribution in a far field. The antenna under measurement 110 may be integrated into the transmission device 100 or may be detachable from the transmission device 100.

The transmission device 100 includes a signal generation unit 10 that generates a broadband signal including a plurality of frequency components such as an OFDM signal as a radio signal that is transmitted from the antenna under measurement 110 when the electric field intensity distribution is measured by electric field intensity distribution measurement device 6. The antenna under measurement 110 is, for example, an array antenna including a Massive-MIMO antenna.

Specifically, the signal generation unit 10 includes a baseband unit 10a that generates a base band signal of a broadband signal such as an OFDM signal, and an RF unit 10b. The RF unit 10b frequency-converts the baseband signal generated by the baseband unit 10a into a desired frequency band, and outputs a resultant signal to each of the antenna elements T1 to TN of the antenna under measurement 110.

For example, in a case where the radio signal transmitted from the antenna under measurement 110 of the transmission device 100 is an OFDM signal, the phase difference and the amplitude are calculated for each subcarrier. By using a broadband signal of OFDM or the like, it is possible to measure an electric field intensity signal in a broadband at a time and contribute to realization of a high speed.

Figure 13:
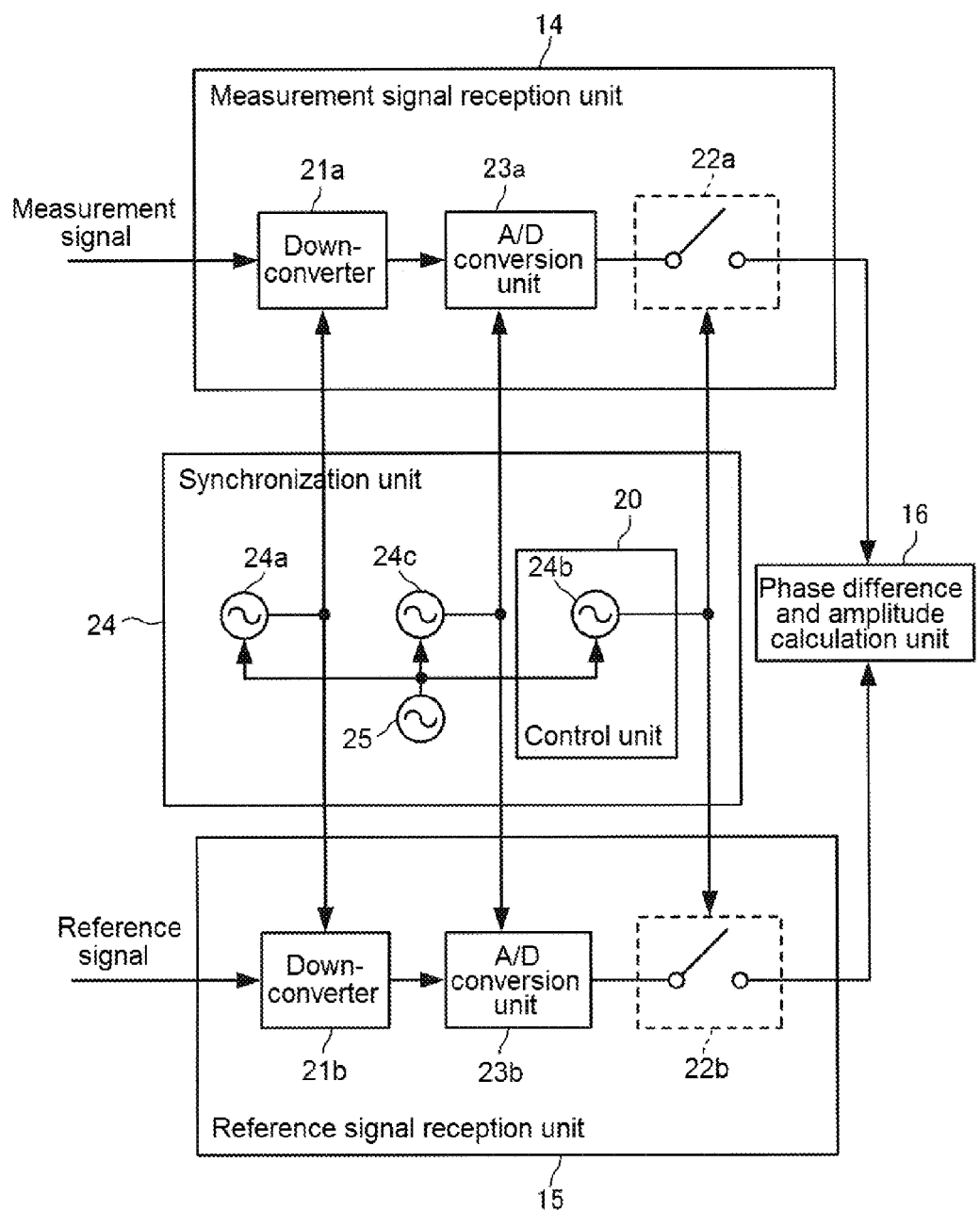
FIG. 13 shows a detail of the synchronization unit according to the sixth embodiment.
Figure 14:
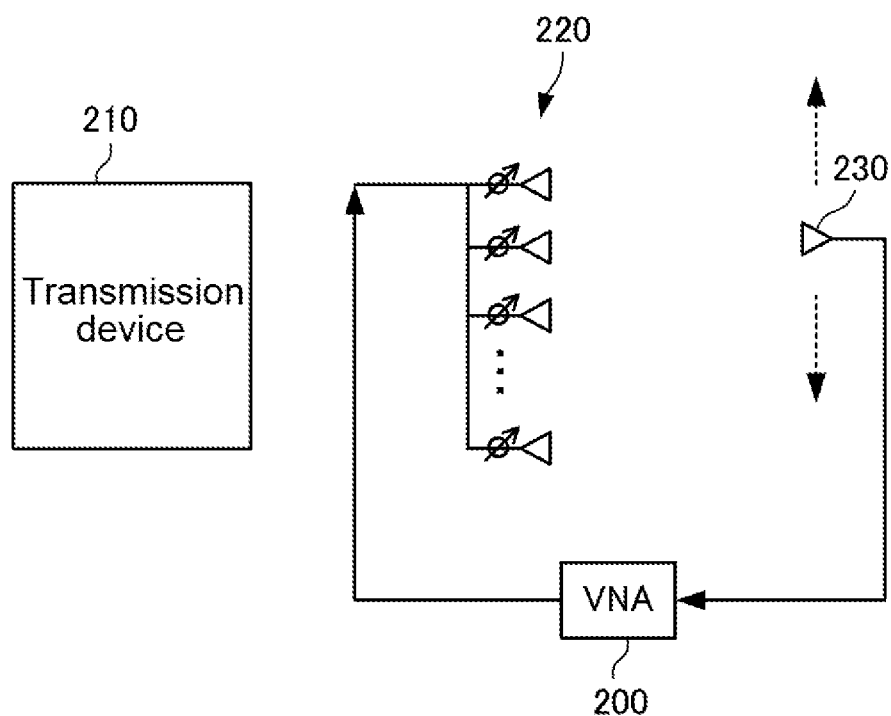
FIG. 14 is a block diagram illustrating a configuration of an electric field intensity distribution measurement device of the related art.

As illustrated in FIG. 13, the synchronization unit 24 includes a local signal source 24a, a synchronization signal source 24b, a clock signal source 24c, and a reference signal source 25, as a configuration for performing synchronization between the measurement signal reception unit 14 and the reference signal reception unit 15.

The measurement signal reception unit 14 includes a down-converter 21a as measurement frequency conversion means, an A/D conversion unit 23a as a measurement A/D conversion unit, and a switch 22a as phase difference and amplitude calculation processing timing synchronization means.

The reference signal reception unit 15 includes a down-converter 21b as reference frequency conversion means, an A/D conversion unit 23b as a reference A/D conversion unit, and a switch 22b as phase difference and amplitude calculation processing timing synchronization means.

As described above, the electric field intensity distribution measurement device 6 according to this embodiment can simultaneously calculate an amplitude and a phase for each frequency component included in the broadband signal transmitted from the antenna under measurement 110 through one scanning of the measurement antenna 11 with respect to each measurement position in the scanning range in a near-field area, and calculate the electric field intensity distribution in the far field from the amplitude and the phase.

Further, in the electric field intensity distribution measurement device 6 according to this embodiment, it is possible to realize high-speed measurement of the amplitude and the phase in the near field by using, for example, an OFDM signal as the broadband signal that is transmitted from the antenna under measurement 110.

Further, in the electric field intensity distribution measurement devices 1 to 6, it is possible to calculate the amplitude and the phase using a modulated signal without using the pilot signal (a signal with constant amplitude).

Next, a method of calculating an amplitude and a phase of a measurement signal received at each scanning point in a near field when a signal that is transmitted from the antenna under measurement 110 is a multi-carrier signal or an OFDM signal in the electric field intensity distribution measurement devices 1 to 6 will be described.

When measurement of a plurality of frequency points is performed in the near-field measurement, a signal of a multi-carrier is transmitted from a transmitter, the multi-carrier signal or the OFDM signal is collectively received by the measurement antenna 11 each time the measurement antenna 11 is moved to each position of the scanning point by operating the movement device 13 of the scanning control unit 30, the signal is sampled by the A/D conversion unit 23a, and FFT calculation is performed. Accordingly, since the amplitude and the phase of a plurality of frequencies can be obtained, high-speed measurement can be realized.

In addition, there is a method of receiving a frequency of a signal that is transmitted from the transmission device 100 each time movement device 13 of the scanning control unit 30 is operated, a plurality of times while switching the frequency, and obtaining amplitude and phase information. Alternatively, there is a method of fixing a frequency of a signal that is transmitted from the transmission device 100, receiving a measurement signal using the measurement antenna 11 while causing the movement device 13 to perform scanning, obtaining amplitude and phase information, and then, changing the frequency to perform scanning again. From among them, an optimal method is selected by comparing a time of switching of the frequency of the signal transmitted from the transmission device 100 with a time of movement for scanning.

When a transmission signal from a transmitter is a multi-carrier signal, a transmission signal T(t) is expressed as Equation (1) below. Here, the number of carriers is m, $f_i$ indicates a frequency in a carrier number i, and $A_i$ indicates an amplitude in the carrier number i.

$$T(t)=\Sigma_{k=0}^{m} A_k \cos(2\pi f_k t) \quad (1)$$

When T(t) is received at a position $(x_j, y_j)$ in a near field plane and A/D conversion results are $R_0, R_1, R_2, \ldots, R_{N-1}$, a result of the FFT calculation is as follows.

$$F_k(x_j, y_j) = \sum_{n=0}^{N-1} R_n W^{nk}, \quad W = e^{-j\frac{2\pi}{N}}$$

Here, if the frequency of $f_i$ is selected so that $$f_k = \frac{f_{samp} \times k}{N},$$

(k=0 . . . m), a component of each subcarrier of the multi-carrier signal can be obtained only through FFT calculation. Here, $f_{samp}$ indicates a sampling frequency, an N indicates the number of samples that are used for FFT calculation. n indicates an index of the time. indicates an index for a measurement position and is assumed to have a value of 0 to p.

Since $F_k(x_j, y_j)$ is a complex number, $F_k(x_j,y_j)$ includes information on both the amplitude and the phase. That is, the amplitude and phase information of each subcarrier at the measurement antenna at a position $(x_j, y_j)$ in the near field plane can be obtained through one measurement.

Amplitude and phase information $F_k(x_0,y_0)$, $F_k(x_1,y_1), \ldots, F_k(x_p,y_p)$ of each sub-carrier at a position $(x_0, y_0)$, a position $(x_1, y_1), \ldots,$ a position $(x_p, y_p)$ can be obtained by comparing amplitudes and phases of a plurality of sub-carriers measured at the measurement antenna 11 and the reference antenna 12 for the signal transmitted from the same transmission device 100, for each sub-carrier. If k=0, 1, . . . , m, $F_0(x_0, y_0), F_1(x_0,y_0), \ldots, F_m(x_0,y_0)$ are obtained for position $(x_0, y_0)$.

The same applies when j=1 to p.

It is possible to obtain far-field directivity for a plurality of sub-carriers by repeating the measurement in a desired scanning range and applying a near-field far-field transformation to the amplitude and phase distribution for each sub-carrier for the amplitude and phase distribution for each subcarrier on the near field plane.

DESCRIPTION OF REFERENCE NUMERALS AND SIGNS 1 to 6 electric field intensity distribution measurement device 11 measurement antenna
12 reference antenna
14, 45 measurement signal reception unit
15, 46 reference signal reception unit
16 phase difference and amplitude calculation unit
17 far-field electric field intensity distribution calculation unit
20 control unit
21a down-converter (measurement frequency conversion means)
21b down-converter (reference frequency conversion means)
22a, 22b switch (phase difference and amplitude calculation processing timing synchronization means)
23a A/D conversion unit (measurement A/D conversion unit)
23b A/D conversion unit (reference A/D conversion unit)
24a local signal source (frequency synchronization means)
24b synchronization signal source (phase difference and amplitude calculation processing timing synchronization means)
24c clock signal source (A/D conversion clock synchronization means)
25 reference signal source
30 scanning control unit
40a, 40b, 44a, 44b, 44c, 44d, 44e cable
41a, 41b connector
42 measurement down-converter (measurement frequency conversion means)
43 reference down-converter (reference frequency conversion means)
50 spectrum analysis unit
51 down-converter
52 frequency conversion unit
53 A/D conversion unit
54 sweep control unit
55 analysis processing unit
100 transmission device
110 antenna
T1 to TN antenna element

What is claimed is:

1. An electric field intensity distribution measurement device that measures a radio signal transmitted from an antenna under measurement in a near field and calculates an electric field intensity distribution in a far field, the electric field intensity distribution measurement device comprising:
   a measurement antenna that receives the radio signal as a measurement signal at a plurality of scanning points included in a predetermined scanning range;
   a reference antenna that receives the radio signal as a reference signal;
   measurement frequency conversion means for frequency converting the measurement signal received by the measurement antenna;
   reference frequency conversion means for frequency converting the reference signal received by the reference antenna;
   a phase difference and amplitude calculation unit that calculates a phase difference between a phase of a digitized version of the frequency-converted measurement signal and a phase of a digitized version of the frequency-converted reference signal with respect to each scanning point, and calculates an amplitude of the digitized version of the frequency-converted measurement signal; and
   a far-field electric field intensity distribution calculation unit that calculates the electric field intensity distribution in the far field of the antenna under measurement, using information on the phase difference and the amplitude calculated by the phase difference and amplitude calculation unit.

2. The electric field intensity distribution measurement device according to claim 1,
   wherein the antenna under measurement includes a plurality of antenna elements integrated in a transmission device, and
   the reference antenna is arranged outside the scanning range.

3. The electric field intensity distribution measurement device according to claim 2, further comprising:
   frequency synchronization means for performing frequency synchronization between the measurement frequency conversion means and the reference frequency conversion means;
   phase difference and amplitude calculation processing timing synchronization means for synchronizing timings of start of data acquisition to the phase difference and amplitude calculation unit of the digitized version of the frequency-converted measurement signal and the digitized version of the frequency-converted reference signal; and
   A/D conversion clock synchronization means for synchronizing sampling clocks used for digitizing the frequency-converted measurement signal and the frequency-converted reference signal.

4. The electric field intensity distribution measurement device according to claim 3, wherein the measurement frequency conversion means includes a measurement down-converter that is directly connected to a connector for the measurement antenna.

5. The electric field intensity distribution measurement device according to claim 3, further comprising: a spectrum analysis unit that analyzes a spectrum of the measurement signal received by the measurement antenna.

6. The electric field intensity distribution measurement device according to claim 2, wherein the radio signal is an unmodulated wave signal.

7. The electric field intensity distribution measurement device according to claim 2, wherein the radio signal is a broadband signal including a plurality of frequency components.

8. The electric field intensity distribution measurement device according to claim 5, wherein the spectrum analysis unit is configured to perform various types of analysis involving a frequency, an occupied bandwidth, adjacent channel leakage power, and spurious radiation.

9. The electric field intensity distribution measurement device according to claim 5,
   wherein the frequency synchronization means is a local signal source installed in the spectrum analysis unit, and
   the local signal source is shared by a spectrum analysis frequency conversion means included in the spectrum analysis unit, the measurement frequency conversion means, and the reference frequency conversion means.

10. The electric field intensity distribution measurement device according to claim 5,
    wherein the measurement signal frequency-converted by the measurement frequency conversion means is branched before being digitized and input to spectrum analysis frequency conversion means included in the spectrum analysis unit, and the spectrum analysis unit includes a local signal source of the spectrum analysis frequency conversion means.

11. The electric field intensity distribution measurement device according to claim 8, wherein the digitized version of the frequency-converted measurement signal is directly input to the spectrum analysis unit.

12. The electric field intensity distribution measurement device according to claim 3,
wherein the measurement frequency conversion means includes a measurement down-converter connected in close proximity to a connector of the measurement antenna, and
the measurement down-converter includes
a frequency multiplier that frequency-multiplies a local signal generated by the frequency synchronization means;
a mixer that mixes the measurement signal received by the measurement antenna with the local signal frequency-multiplied by the frequency multiplier; and
a filter that removes unnecessary frequency components from an output signal of the mixer.

13. The electric field intensity distribution measurement device according to claim 3,
wherein the measurement frequency conversion means includes a measurement down-converter connected in close proximity to a connector of the measurement antenna, and
the measurement down-converter includes
a harmonic mixer that frequency-converts the measurement signal received by the measurement antenna using a frequency component obtained by performing frequency multiplication on a local signal generated by the frequency synchronization means; and
a filter that removes unnecessary frequency components from an output signal of the harmonic mixer.

14. The electric field intensity distribution measurement device according to claim 4, wherein the reference frequency conversion means includes a reference down-converter directly connected to a connector of the reference antenna.

15. The electric field intensity distribution measurement device according to claim 2, wherein the measurement frequency conversion means includes a measurement down-converter connected in close proximity to a connector of the measurement antenna.

16. The electric field intensity distribution measurement device according to claim 4, wherein the reference frequency conversion means includes a reference down-converter connected in close proximity to a connector of the reference antenna.

17. The electric field intensity distribution measurement device according to claim 1, further comprising: a spectrum analysis unit that analyzes a spectrum of the measurement signal received by the measurement antenna.

18. The electric field intensity distribution measurement device according to claim 4, further comprising: a spectrum analysis unit that analyzes a spectrum of the measurement signal received by the measurement antenna.

19. The electric field intensity distribution measurement device according to claim 15, further comprising: a spectrum analysis unit that analyzes a spectrum of the measurement signal received by the measurement antenna.

20. An electric field intensity distribution measurement method using an electric field intensity distribution measurement device that measures a radio signal transmitted from an antenna under measurement in a near field and calculates an electric field intensity distribution in a far field, the electric field intensity distribution measurement device comprising a measurement antenna that receives the radio signal as a measurement signal at a plurality of scanning points included in a predetermined scanning range; a reference antenna that receives the radio signal as a reference signal; measurement frequency conversion means for frequency-converting the measurement signal received by the measurement antenna; reference frequency conversion means for frequency converting the reference signal received by the reference antenna; a phase difference and amplitude calculation unit that calculates a phase difference between a phase of a digitized version of the frequency-converted measurement signal and a phase of a digitized version of the frequency-converted reference signal with respect to each scanning point, and calculates an amplitude of the digital measurement signal; and a far-field electric field intensity distribution calculation unit that calculates the electric field intensity distribution in the far field of the antenna under measurement, using information on the phase difference and the amplitude calculated by the phase difference and amplitude calculation unit, the electric field intensity distribution measurement method comprising:

a synchronization step (S1) of performing frequency synchronization between the measurement frequency conversion means and the reference frequency conversion means, and synchronizing sampling clocks used to generated the digitized version of the frequency-converted measurement signal and the digitized version of the frequency-converted reference signal;

a signal reception step (S4) of receiving the radio signal as the measurement signal at the plurality of scanning points included in the predetermined scanning range using the measurement antenna, and receiving the radio signal as the reference signal using the reference antenna;

a frequency conversion step (S5) of frequency-converting the measurement signal received in the signal reception step using the measurement frequency conversion means and frequency-converting the reference signal received in the signal reception step using the reference frequency conversion means;

an analog to digital (A/D) conversion step (S6) of simultaneously digitizing the measurement signal and the reference signal frequency-converted in the frequency conversion step to generate the digitized version of the frequency-converted measurement signal and the digitized version of the frequency-converted reference signal;

a phase difference and amplitude calculation step (S7) of calculating the phase difference between the phase of the digitized version of the frequency-converted measurement signal and the phase of the digitized version of the frequency-converted reference signal with respect to each scanning point, and calculating the amplitude of the digital measurement signal; and a far-field electric field intensity distribution calculation step (S9) of calculating the electric field intensity distribution in the far field using information on the phase difference and the amplitude calculated in the phase difference and amplitude calculation step.

* * * * *